United States Patent
Brewer et al.

(10) Patent No.: US 9,015,399 B2
(45) Date of Patent: Apr. 21, 2015

(54) MULTIPLE DATA CHANNEL MEMORY MODULE ARCHITECTURE

(75) Inventors: Tony M. Brewer, Plano, TX (US); J. Michael Andrewartha, Plano, TX (US); William D. O'Leary, Plano, TX (US); Michael K. Dugan, Richardson, TX (US)

(73) Assignee: Convey Computer, Richardson, TX (US)

( * ) Notice: Subject to any disclaimer, the term of this patent is extended or adjusted under 35 U.S.C. 154(b) by 668 days.

(21) Appl. No.: 12/186,372

(22) Filed: Aug. 5, 2008

(65) Prior Publication Data

US 2010/0036997 A1    Feb. 11, 2010

(51) Int. Cl.
*G06F 12/06* (2006.01)
*G06F 12/04* (2006.01)

(52) U.S. Cl.
CPC ............ *G06F 12/04* (2013.01); *G06F 12/0607* (2013.01)

(58) Field of Classification Search
CPC ............ G06F 9/30036; G06F 9/30109; G06F 9/3877; G06F 9/3887; G06F 9/3897; G06F 15/8084; G06F 9/30112; G06F 9/30189; G06F 9/3885; G06F 12/0607
USPC ................................................ 711/5, E12.082
See application file for complete search history.

(56) References Cited

U.S. PATENT DOCUMENTS

| | | |
|---|---|---|
| 3,434,114 A | 3/1969 | Arulprahasam et al. |
| 4,128,880 A | 12/1978 | Cray, Jr. |
| 4,386,399 A | 5/1983 | Rasala et al. |
| 4,685,076 A | 8/1987 | Yoshida et al. |
| 4,817,140 A | 3/1989 | Chandra et al. |
| 4,897,783 A | 1/1990 | Nay |
| 5,027,272 A | 6/1991 | Samuels |
| 5,109,499 A | 4/1992 | Inagami et al. |
| 5,117,487 A | 5/1992 | Nagata |
| 5,202,969 A | 4/1993 | Sato et al. |
| 5,222,224 A | 6/1993 | Flynn et al. |

(Continued)

FOREIGN PATENT DOCUMENTS

WO    WO-2008/014494    1/2008

OTHER PUBLICATIONS

Vassiliadis et al., "The Arise Reconfigurable Instruction Set Extension Framework", Jul. 16, 2007.

(Continued)

*Primary Examiner* — Yong Choe
(74) *Attorney, Agent, or Firm* — Norton Rose Fulbright US LLP

(57) ABSTRACT

The present invention is directed generally to systems and methods which provide a memory module having multiple data channels that are independently accessible (i.e., a multi-data channel memory module). According to one embodiment, the multi-data channel memory module enables a plurality of independent sub-cache-block accesses to be serviced simultaneously. In addition, the memory architecture also supports cache-block accesses. For instance, multiple ones of the data channels may be employed for servicing a cache-block access. In one embodiment a DIMM architecture that comprises multiple data channels is provided. Each data channel supports a sub-cache-block access, and multiple ones of the data channels may be used for supporting a cache-block access. The plurality of data channels to a given DIMM may be used simultaneously to support different, independent memory access operations.

57 Claims, 7 Drawing Sheets

(56) References Cited

U.S. PATENT DOCUMENTS

| | | | |
|---|---|---|---|
| 5,283,886 A | 2/1994 | Nishii et al. | |
| 5,513,366 A | 4/1996 | Agarwal et al. | |
| 5,598,546 A | 1/1997 | Blomgren | |
| 5,664,136 A | 9/1997 | Witt et al. | |
| 5,752,035 A | 5/1998 | Trimberger | |
| 5,838,984 A | 11/1998 | Nguyen et al. | |
| 5,887,182 A | 3/1999 | Kinoshita et al. | |
| 5,887,183 A | 3/1999 | Agarwal et al. | |
| 5,920,721 A | 7/1999 | Hunter et al. | |
| 5,935,204 A | 8/1999 | Shimizu et al. | |
| 5,937,192 A | 8/1999 | Martin | |
| 5,941,938 A | 8/1999 | Thayer | |
| 5,999,734 A | 12/1999 | Willis et al. | |
| 6,006,319 A | 12/1999 | Takahashi et al. | |
| 6,023,755 A | 2/2000 | Casselman | |
| 6,075,546 A | 6/2000 | Hussain et al. | |
| 6,076,139 A * | 6/2000 | Welker et al. | 711/104 |
| 6,076,152 A | 6/2000 | Huppenthal et al. | |
| 6,097,402 A | 8/2000 | Case et al. | |
| 6,125,421 A * | 9/2000 | Roy | 711/5 |
| 6,154,419 A * | 11/2000 | Shakkarwar | 365/235 |
| 6,170,001 B1 | 1/2001 | Hinds et al. | |
| 6,175,915 B1 | 1/2001 | Cashman et al. | |
| 6,195,676 B1 | 2/2001 | Spix et al. | |
| 6,202,133 B1 | 3/2001 | Jeddeloh | |
| 6,209,067 B1 | 3/2001 | Collins et al. | |
| 6,240,508 B1 | 5/2001 | Brown, III et al. | |
| 6,308,255 B1 | 10/2001 | Gorishek, IV et al. | |
| 6,339,813 B1 * | 1/2002 | Smith et al. | 711/144 |
| 6,342,892 B1 | 1/2002 | Hook et al. | |
| 6,434,687 B1 | 8/2002 | Huppenthal | |
| 6,473,831 B1 * | 10/2002 | Schade | 711/115 |
| 6,480,952 B2 | 11/2002 | Gorishek, IV et al. | |
| 6,567,900 B1 | 5/2003 | Kessler | |
| 6,611,908 B2 | 8/2003 | Lentz et al. | |
| 6,665,790 B1 | 12/2003 | Glossner, III et al. | |
| 6,684,305 B1 | 1/2004 | Deneau | |
| 6,701,424 B1 | 3/2004 | Liao et al. | |
| 6,738,967 B1 | 5/2004 | Radigan | |
| 6,789,167 B2 | 9/2004 | Naffziger | |
| 6,831,979 B2 | 12/2004 | Callum | |
| 6,839,828 B2 | 1/2005 | Gschwind et al. | |
| 6,868,472 B1 | 3/2005 | Miyake et al. | |
| 6,891,543 B2 | 5/2005 | Wyatt | |
| 6,954,845 B2 | 10/2005 | Arnold et al. | |
| 6,983,456 B2 | 1/2006 | Poznanovic et al. | |
| 7,000,211 B2 | 2/2006 | Arnold | |
| 7,065,631 B2 | 6/2006 | Weaver | |
| 7,120,755 B2 | 10/2006 | Jamil et al. | |
| 7,149,867 B2 | 12/2006 | Poznanovic et al. | |
| 7,167,971 B2 | 1/2007 | Asaad et al. | |
| 7,225,324 B2 | 5/2007 | Huppenthal et al. | |
| 7,257,757 B2 | 8/2007 | Chun et al. | |
| 7,278,122 B2 | 10/2007 | Willis | |
| 7,328,195 B2 | 2/2008 | Willis | |
| 7,367,021 B2 | 4/2008 | Ansari et al. | |
| 7,376,812 B1 | 5/2008 | Sanghavi et al. | |
| 7,418,571 B2 | 8/2008 | Wolrich et al. | |
| 7,421,565 B1 | 9/2008 | Kohn | |
| 7,546,441 B1 | 6/2009 | Ansari et al. | |
| 7,577,822 B2 | 8/2009 | Vorbach | |
| 7,643,353 B1 | 1/2010 | Srinivasan et al. | |
| 8,122,229 B2 | 2/2012 | Wallach et al. | |
| 8,156,307 B2 | 4/2012 | Wallach et al. | |
| 2001/0011342 A1 | 8/2001 | Pechanek et al. | |
| 2001/0049816 A1 | 12/2001 | Rupp | |
| 2002/0046324 A1 | 4/2002 | Barroso et al. | |
| 2003/0005424 A1 | 1/2003 | Ansari et al. | |
| 2003/0140222 A1 | 7/2003 | Ohmi et al. | |
| 2003/0226018 A1 | 12/2003 | Tardo et al. | |
| 2004/0003170 A1 | 1/2004 | Gibson et al. | |
| 2004/0107331 A1 | 6/2004 | Baxter | |
| 2004/0117599 A1 | 6/2004 | Mittal et al. | |
| 2004/0193837 A1 | 9/2004 | Devaney et al. | |
| 2004/0193852 A1 | 9/2004 | Johnson | |
| 2004/0194048 A1 | 9/2004 | Arnold | |
| 2004/0215898 A1 | 10/2004 | Arimilli et al. | |
| 2004/0221127 A1 | 11/2004 | Ang | |
| 2004/0236920 A1 | 11/2004 | Sheaffer | |
| 2004/0243984 A1 | 12/2004 | Vorbach et al. | |
| 2004/0250046 A1 | 12/2004 | Gonzalez et al. | |
| 2005/0027970 A1 | 2/2005 | Arnold et al. | |
| 2005/0044539 A1 | 2/2005 | Liebenow | |
| 2005/0108503 A1 | 5/2005 | Sandon et al. | |
| 2005/0172099 A1 | 8/2005 | Lowe | |
| 2005/0188368 A1 | 8/2005 | Kinney | |
| 2005/0223369 A1 | 10/2005 | Chun et al. | |
| 2005/0262278 A1 | 11/2005 | Schmidt | |
| 2006/0075060 A1 | 4/2006 | Clark | |
| 2006/0149941 A1 | 7/2006 | Colavin et al. | |
| 2006/0259737 A1 | 11/2006 | Sachs et al. | |
| 2006/0288191 A1 | 12/2006 | Asaad et al. | |
| 2007/0005881 A1 | 1/2007 | Garney | |
| 2007/0005932 A1 | 1/2007 | Covelli et al. | |
| 2007/0038843 A1 | 2/2007 | Trivedi et al. | |
| 2007/0106833 A1 | 5/2007 | Rankin et al. | |
| 2007/0130445 A1 | 6/2007 | Lau et al. | |
| 2007/0153907 A1 | 7/2007 | Mehta et al. | |
| 2007/0157166 A1 | 7/2007 | Stevens | |
| 2007/0186210 A1 | 8/2007 | Hussain et al. | |
| 2007/0226424 A1 | 9/2007 | Clark et al. | |
| 2007/0245097 A1 | 10/2007 | Gschwind et al. | |
| 2007/0283336 A1 | 12/2007 | Gschwind et al. | |
| 2007/0288701 A1 | 12/2007 | Hofstee et al. | |
| 2007/0294666 A1 | 12/2007 | Papakipos et al. | |
| 2008/0059758 A1 | 3/2008 | Sachs | |
| 2008/0059759 A1 | 3/2008 | Sachs | |
| 2008/0059760 A1 | 3/2008 | Sachs | |
| 2008/0104365 A1 | 5/2008 | Kohno et al. | |
| 2008/0209127 A1 | 8/2008 | Brokenshire et al. | |
| 2008/0215854 A1 | 9/2008 | Asaad et al. | |
| 2009/0172364 A1 | 7/2009 | Sprangle et al. | |
| 2009/0219779 A1 * | 9/2009 | Mao et al. | 365/233.11 |
| 2010/0002572 A1 | 1/2010 | Garrett | |
| 2010/0138587 A1 | 6/2010 | Hutson | |
| 2011/0055516 A1 | 3/2011 | Willis | |

OTHER PUBLICATIONS

Gerald Estrin, "Organization of Computer Systems—The Fixed Plus Variable Structure Computer", 1960.

Hauck, S. "The Roles of FPGAs in Reprogrammable Systems", Proceedings fo the IEEE, vol. 86, No. 4, 615-638, Apr. 1998.

Shirazi et al., "Run-Time Management of Dynamically Reconfigurable Designs", Field-Programmable Logic and Applications from FPGAs to Computing Paradigm, 1998.

Page, I., "Reconfigurable Processor Architectures", Microprocessors and Microsystems, vol. 20, Issue 3 May 1996, pp. 185-196.

Callahan et al., "The Garp Architecture and C Compiler", Computer, vol. 33, No. 4. pp. 62-69, Apr. 2000.

Siewiorek, Daniel P.; Bell, Gordon C.; Newell, Allen; "Computer Structures: Principles and Examples" McGraw-Hill, 1982, p. 334, Figure 1(a).

Cray XD1™ FPGA Development, Release 1.2; S-6400-12, issued Apr. 18, 2005. Available at www.eng.uah.edu/~jacksoa/CrayXD1FPGADevelopment.pdf.

Callahan, Timothy J.; Hauser, John R.; Wawrzynek, John; "The Garp Architecture and C Compiler", IEEE Computer, vol. 33, No. 4, pp. 62-69, Apr. 2000.

Poster entitled GigaScale Mixed-Signal System Verification, FTL Systems, Inc. presented at the DARPA/MTO Team/NeoCAD2003 Fall Review, Sep. 15-17, 2003, Monterey, CA, a public unclassified meeting.

Poster entitled StarStream™ GigaScale Mixed-Signal System Verification, FTL Systems, Inc. presented at the DARPA/MTO Team/NeoCAD Program Review, Feb. 23, 2004, Scottsdale, AZ, Monterey, CA, a public unclassified meeting.

StarStream Design Summary; FTL Systems, Inc., available at Design Automation Conference (DAC), Jun. 2005, Anaheim, CA.

Gokhale, Maya; "Heterogeneous Processing", Los Alamos Computer Science Institute LACSI 2006, Oct. 17-19, 2006, Santa Fe, NM.

(56) References Cited

OTHER PUBLICATIONS

Available at www.cct.lsu.edu/~estrabd/LACSI2006/workshops/workshop5/gokhale_mccormick.pdf.

L.N. Bhuyan, "Lecture 15: Symmetric Multiprocessor: Cache Protocols", Feb. 28, 2001, 16 pgs.

Levine et al., "Efficient Application Representation for HASTE: Hybrid Architectures with a Single, Transformable Executable", 2003, 10 pgs.

International Search Report and Written Opinion issued for PCT/US09/60820, dated Dec. 9, 2009, 8 pgs.

International Search Report and Written Opinion issued for PCT/US09/60811, dated Dec. 1, 2009, 7 pgs.

U.S. Appl. No. 11/841,406, Wallach et al.

U.S. Appl. No. 11/847,169, Wallach et al.

International Search Report and Written Opinion issued for PCT/US08/74566 dated Nov. 14, 2008, 9 pgs.

International Search Report and Written Opinion issued for PCT/US08/75828 dated Nov. 18, 2008, 12 pgs.

International Search Report and Written Opinion issued for PCT/US08/73423 dated Nov. 12, 2008, 12 pgs.

Arnold, Jeffrey M., "The Splash 2 Processor and Applications", 1993 IEEE, pp. 482-485.

Gokhale, Maya, "Reconfigurable Computing", Accelerating Computation with Field-Programmable Gate Arrays, © Springer, pp. 4 and 60-64.

Express Corporation, "XSA Board V1.1, V1.2 User Manual" (Release Date: Jun. 23, 2005).

Express, "XSA-50 Spartan-2 Prototyping Board with 2.5V, 50,000-gate FPGA" (copyright 1998-2008).

International Search Report and Written Opinion issued for PCT/US08/87233, dated Feb. 5, 2009, 11 pgs.

International Search Report and the Written Opinion issued for PCT/US2009/051096, dated Oct. 26, 2009, 9 pages.

Belgard, Rich, "Reconfigurable Illogic", Microprocessor, The Insiders Guide to Microprocessor Hardware, May 10, 2004, 4 pgs.

Trednnick, Nick et al., "Microprocessor Sunset", Microprocessor, The Insiders Guide to Microprocessor Hardware, May 3, 2004, 4 pgs.

The PC Guide, "The PC's x86 Instruction Set", 2004, www.pcguide.com/ref/cup.arch/int/instX86-c.html, 3 pgs.

Andreas Koch et al., "A Universal Co-Processor for Workstations", 1994, Abingdon EE&CS Books, 14 pgs.

* cited by examiner

MULTIPLE DATA CHANNEL MEMORY MODULE ARCHITECTURE

CROSS-REFERENCE TO RELATED APPLICATIONS

The present application relates to the following co-pending and commonly-assigned U.S. Patent Applications: 1) U.S. patent application Ser. No. 11/841,406 filed Aug. 20, 2007 titled "MULTI-PROCESSOR SYSTEM HAVING AT LEAST ONE PROCESSOR THAT COMPRISES A DYNAMICALLY RECONFIGURABLE INSTRUCTION SET", 2) U.S. patent application Ser. No. 11/854,432 filed Sep. 12, 2007 titled "DISPATCH MECHANISM FOR DISPATCHING INSTRUCTIONS FROM A HOST PROCESSOR TO A CO-PROCESSOR", 3) U.S. patent application Ser. No. 11/847,169 filed Aug. 29, 2007 titled "COMPILER FOR GENERATING AN EXECUTABLE COMPRISING INSTRUCTIONS FOR A PLURALITY OF DIFFERENT INSTRUCTION SETS", 4) U.S. patent application Ser. No. 11/969,792 filed Jan. 4, 2008 titled "MICROPROCESSOR ARCHITECTURE HAVING ALTERNATIVE MEMORY ACCESS PATHS", and 5) concurrently-filed U.S. patent application Ser. No. 12/186,344 titled "MEMORY INTERLEAVE FOR HETEROGENEOUS COMPUTING", the disclosures of which are hereby incorporated herein by reference.

TECHNICAL FIELD

The following description relates generally to memory modules, such as dual in-line memory modules (DIMMs), and more particularly to a memory module architecture that has multiple data channels (i.e., a multi-data channel memory module architecture). In certain embodiments, a memory module comprises a plurality of data channels that each enable a sub-cache-block of data to be accessed for independent operations. Further, in certain embodiments, multiple ones of the data channels may be employed to support a cache-block access of data.

BACKGROUND

The popularity of computing systems continues to grow and the demand for improved processing architectures thus likewise continues to grow. Ever-increasing desires for improved computing performance/efficiency has led to various improved processor architectures. For example, multi-core processors are becoming more prevalent in the computing industry and are being used in various computing devices, such as servers, personal computers (PCs), laptop computers, personal digital assistants (PDAs), wireless telephones, and so on.

In the past, processors such as CPUs (central processing units) featured a single execution unit to process instructions of a program. More recently, computer systems are being developed with multiple processors in an attempt to improve the computing performance of the system. In some instances, multiple independent processors may be implemented in a system. In other instances, a multi-core architecture may be employed, in which multiple processor cores are amassed on a single integrated silicon die. Each of the multiple processors (e.g., processor cores) can simultaneously execute program instructions. This parallel operation of the multiple processors can improve performance of a variety of applications.

A multi-core CPU combines two or more independent cores into a single package comprised of a single piece silicon integrated circuit (IC), called a die. In some instances, a multi-core CPU may comprise two or more dies packaged together. A dual-core device contains two independent microprocessors and a quad-core device contains four microprocessors. Cores in a multi-core device may share a single coherent cache at the highest on-device cache level (e.g., L2 for the Intel® Core 2) or may have separate caches (e.g. current AMD® dual-core processors). The processors also share the same interconnect to the rest of the system. Each "core" may independently implement optimizations such as superscalar execution, pipelining, and multithreading. A system with N cores is typically most effective when it is presented with N or more threads concurrently.

One processor architecture that has been developed utilizes multiple processors (e.g., multiple cores), which are homogeneous. As discussed hereafter, the processors are homogeneous in that they are all implemented with the same fixed instruction sets (e.g., Intel's x86 instruction set, AMD's Opteron instruction set, etc.). Further, the homogeneous processors access memory in a common way, such as all of the processors being cache-line oriented such that they access a cache block (or "cache line") of memory at a time, as discussed further below.

In general, a processor's instruction set refers to a list of all instructions, and all their variations, that the processor can execute. Such instructions may include, as examples, arithmetic instructions, such as ADD and SUBTRACT; logic instructions, such as AND, OR, and NOT; data instructions such as MOVE, INPUT, OUTPUT, LOAD, and STORE; and control flow instructions, such as GOTO, if X then GOTO, CALL, and RETURN. Examples of well-known instruction sets include x86 (also known as IA-32), x86-64 (also known as AMD64 and Intel® 64), AMD's Opteron, VAX (Digital Equipment Corporation), IA-64 (Itanium), and PA-RISC (HP Precision Architecture).

Generally, the instruction set architecture is distinguished from the microarchitecture, which is the set of processor design techniques used to implement the instruction set. Computers with different microarchitectures can share a common instruction set. For example, the Intel® Pentium and the AMD® Athlon implement nearly identical versions of the x86 instruction set, but have radically different internal microarchitecture designs. In all these cases the instruction set (e.g., x86) is fixed by the manufacturer and directly hardware implemented, in a semiconductor technology, by the microarchitecture. Consequently, the instruction set is traditionally fixed for the lifetime of this implementation.

FIG. 1 shows a block-diagram representation of an exemplary prior art system 100 in which multiple homogeneous processors (or cores) are implemented. System 100 comprises two subsystems: 1) a main memory (physical memory) subsystem 101 and 2) a processing subsystem 102 (e.g., a multi-core die). System 100 includes a first microprocessor core 104A and a second microprocessor core 104B. In this example, microprocessor cores 104A and 104B are homogeneous in that they are each implemented to have the same, fixed instruction set, such as x86. In addition, each of the homogeneous microprocessor cores 104A and 104B access main memory 101 in a common way, such as via cache block accesses, as discussed hereafter. Further, in this example, cores 104A and 104B are implemented on a common die 102. Main memory 101 is communicatively connected to processing subsystem 102. Main memory 101 comprises a common physical address space that microprocessor cores 104A and 104B can each reference.

As shown further in FIG. 1, a cache 103 is also implemented on die 102. Cores 104A and 104B are each communicatively coupled to cache 103. As is well known, a cache generally is memory for storing a collection of data duplicating original values stored elsewhere (e.g., to main memory 101) or computed earlier, where the original data is expensive to fetch (due to longer access time) or to compute, compared to the cost of reading the cache. In other words, a cache 103 generally provides a temporary storage area where frequently accessed data can be stored for rapid access. Once the data is stored in cache 103, future use can be made by accessing the cached copy rather than re-fetching the original data from main memory 101, so that the average access time is shorter. In many systems, cache access times are approximately 50 times faster than similar accesses to main memory 101. Cache 103, therefore, helps expedite data access that the micro-cores 104A and 104B would otherwise have to fetch from main memory 101.

In many system architectures, each core 104A and 104B will have its own cache also, commonly called the "L1" cache, and cache 103 is commonly referred to as the "L2" cache. Unless expressly stated herein, cache 103 generally refers to any level of cache that may be implemented, and thus may encompass L1, L2. etc. Accordingly, while shown for ease of illustration as a single block that is accessed by both of cores 104A and 104B, cache 103 may include L1 cache that is implemented for each core.

In many system architectures, virtual addresses are utilized. In general, a virtual address is an address identifying a virtual (non-physical) entity. As is well-known in the art, virtual addresses may be utilized for accessing memory. Virtual memory is a mechanism that permits data that is located on a persistent storage medium (e.g., disk) to be referenced as if the data was located in physical memory. Translation tables, maintained by the operating system, are used to determine the location of the reference data (e.g., disk or main memory). Program instructions being executed by a processor may refer to a virtual memory address, which is translated into a physical address. To minimize the performance penalty of address translation, most modern CPUs include an on-chip Memory Management Unit (MMU), and maintain a table of recently used virtual-to-physical translations, called a Translation Look-aside Buffer (TBL). Addresses with entries in the TLB require no additional memory references (and therefore time) to translate. However, the TLB can only maintain a fixed number of mappings between virtual and physical addresses; when the needed translation is not resident in the TLB, action will have to be taken to load it in. As an example, suppose a program's instruction stream that is being executed by a processor, say processor core 104A of FIG. 1, desires to load data from an address "Foo" into a first general-purpose register, GPR1. Such instruction may appear similar to "LD<Foo>, GPR1". Foo, in this example, is a virtual address that the processor translates to a physical address, such as address "1223456". Thus, the actual physical address, which may be formatted according to a global physical memory address format, is used to access cache 103 and/or memory 101.

In operation, each of cores 104A and 104 reference main memory 101 by providing a physical memory address. The physical memory address (of data or "an operand" that is desired to be retrieved) is first presented to cache 103. If the addressed data is not encached (i.e., not present in cache 103), the same physical address is presented to main memory 101 to retrieve the desired data. Main memory 101 may be implemented in whole or in part via memory module(s), such as dual in-line memory modules (DIMMs), which may employ dynamic random access memory (DRAM) or other memory storage.

In contemporary architectures, the processor cores 104A and 104B are cache-line (or "cache-block") oriented, wherein a "cache block" is fetched from main memory 101 and loaded into cache 103. The terms cache line and cache block are used interchangeably herein. Rather than retrieving only the addressed data from main memory 101 for storage to cache 103, such cache-block oriented processors may retrieve a larger block of data for storage to cache 103. A cache block typically comprises a fixed-size amount of data that is independent of the actual size of the requested data. For example, in most implementations a cache block comprises 64 bytes of data that is fetched from main memory 101 and loaded into cache 103 independent of the actual size of the operand referenced by the requesting micro-core 104A/104B. Furthermore, the physical address of the cache block referenced and loaded is a block address. This means that all the cache block data is in sequentially contiguous physical memory. Table 1 below shows an example of a cache block.

TABLE 1

| Physical Address | Operand |
|---|---|
| XXX(7) | Operand 7 |
| XXX(6) | Operand 6 |
| . . . | . . . |
| XXX(1) | Operand 1 |
| XXX(0) | Operand 0 |

In the above example of table 1, the "XXX" portion of the physical address is intended to refer generically to the corresponding identifier (e.g., numbers and/or letters) for identifying a cache line address. For instance, XXX(0) corresponds to the physical address for an Operand 0, while XXX(1) corresponds to the physical address for an Operand 1 and so on. In the example of table 1, in response to a micro-core 104A/104B requesting Operand 0 via its corresponding physical address XXX(0), a 64-byte block of data may be fetched from main memory 101 and loaded into cache 103, wherein such cache block of data includes not only Operand 0 but also Operands 1-7. Thus, depending on the fixed size of the cache block employed on a given system, whenever a core 104A/104B references one operand (e.g., a simple load), the memory system will bring in 4 to 8 to 16 (or more) operands into cache 103.

There are both advantages and disadvantages of this traditional cache-block oriented approach to memory access. One advantage is that if there is temporal (over time) and spatial (data locality) references to operands (e.g., operands 0-7 in the example of Table 1), then cache 103 reduces the memory access time. Typically, cache access times (and data bandwidth) are 50 times faster than similar access to main memory 101. For many applications, this is the memory access pattern.

However, if the memory access pattern of an application is not sequential and/or does not re-use data, inefficiencies arise which result in decreased performance. Consider the following FORTRAN loop that may be executed for a given application:

```
DO I=1, N, 4
    A(i) = B(i) + C(i)
END DO
```

In this loop, every fourth element is used. If a cache block maintains 8 operands, then only 2 of the 8 operands are used.

Thus, ⅝ of the data loaded into cache 103 and ⅝ of the memory bandwidth is "wasted" in this example.

In multi-processor systems, such as exemplary system 100 of FIG. 1, main memory 101 can be configured to improve performance. FIG. 2 shows a block diagram illustrating a traditional implementation of main memory 101. As shown, memory module 202, which comprises memory (e.g., DRAMs) 203, is accessible via memory controller 201. That is, memory controller 201 controls access to memory module 202. Memory module 202 is commonly implemented as a DIMM (dual in-line memory module) that includes one or more DRAMs (dynamic random access memory) as memory 203. In general, a DIMM is a double SIMM (single in-line memory module). Like a SIMM, a DIMM contains one or several random access memory (RAM) chips on a small circuit board with pins that connect it to the computer motherboard.

Traditional DIMMs provide one data channel 205 and one address/control channel 204 per DIMM. In general, the address/control channel 204 specifies an address and a desired type of access (e.g., read or write), and the data channel 205 carries the corresponding data to/from the specified address for performing the desired type of access. Typically, a memory access operation requires several clock cycles to perform. For instance, address and control information may be provided on the address/control channel 204 over one or more clock cycles, and then the data is provided on the data channel 205 over later clock cycles. In a typical DIMM access scenario, a row select command is sent from memory controller 201 on the address/control channel 204 to the memory module 202, which indicates that an associated address is a row address in the memory cell matrix of the DRAM memory 203. In general, a data bit in DRAM is stored in a memory cell located by the intersection of a column address and a row address. A column access command (e.g., a column read or column write command) is sent from the memory controller 201 over the address/control channel 204 to validate the column address and indicate a type of access desired (e.g., either a read or write operation).

The row select command may be sent in a first clock cycle, then the column access command may be sent in a second clock cycle, and then some clock cycles later a burst of data may be supplied via the data channel 204. The burst of data may be supplied over several clock cycles. Typically, single DIMM data channel 205 is typically a 64-bit (8-byte) wide channel, wherein each access comprises a "burst" length of 8, thus resulting in the data channel carrying 64 bytes for each access. The length of the "burst" may refer to a number of clock cycles or phases of a clock cycle when dual-data rate (DDR) is employed. For instance, a burst length of 8 may refer to 8 clock cycles, wherein 8 bytes of data is communicated on the data channel for a given access in each of the 8 clock cycles (resulting in the data channel carrying 64 bytes of data for the access). As another example, a burst length of 8 may refer to 8 phases of a clock (e.g., when DDR is employed), wherein 8 bytes of data is communicated on the data channel for a given access in each of the 8 phases (over 4 clock cycles), thus resulting in the data channel carrying 64 bytes of data for the access.

To improve data channel bandwidth tiling is commonly employed in memory architectures. For instance, rather than waiting for completion of a burst of data for one access operation before supplying address/control signals for a next access operation, the instructions supplied via the address/control channel 204 may be used to attempt to maintain full bandwidth utilization of the data channel 205. FIG. 3 shows an example of one traditional tiling technique. FIG. 3 shows a clock cycle 301 of a reference clock signal, wherein the illustrated example shows 20 clock cycles numbered 1-20. A clock phase 302 is also shown, wherein for each clock cycle the clock has a low phase ("L") and a high phase ("H"), as is well known. An address/control channel 303 is also shown, which corresponds to address/control channel 204 of FIG. 2. Also, in this example, a data channel 304 is shown, which corresponds to data channel 205 of FIG. 2.

The exemplary tiling technique of FIG. 3 allows for the address/control channel 303 to be used to maintain high bandwidth utilization of the data channel 304. In the illustrated example, a first memory access operation is requested, whereupon a row select command 306 is communicated from memory controller 201 to memory module 202 over address/control channel 303 during clock cycle 1. Then, during clock cycle 2, a column access command (e.g., column read or column write command) 307 for the first memory access operation is communicated from memory controller 201 to memory module 202 over address/control channel 303. After some delay, data channel 304 carries the data "burst" for the first memory access operation. For instance, beginning in the high phase of clock cycle 9 and ending in the low phase of clock cycle 13, data burst 308 carries the data for the first memory access operation. Traditionally, a single DIMM data channel, such as data channel 304, is typically a 64-bit (8-byte) wide channel where each memory access comprises a "burst" length of 8, thus resulting in the data channel carrying 64 bytes for each access. For instance, each of the 8 blocks of burst 308 (labeled 0/0/0-0/0/7) is typically an 8-byte block of data, thus resulting in burst 308 containing 64 bytes of data for the first memory access operation (read or write to/from the specified address).

A second memory access operation is requested in this example, whereupon a row select command 309 is communicated from memory controller 201 to memory module 202 over address/control channel 303 during clock cycle 5. Then, during clock cycle 6, a column access command 310 for the second memory access operation is communicated from memory controller 201 to memory module 202 over address/control channel 303. After some delay, data channel 304 carries the data "burst" for the second memory access operation. For instance, beginning in the high phase of clock cycle 13 and ending in the low phase of clock cycle 17, data burst 311 carries the data for the second memory access operation. As with the data burst 308 discussed above for the first memory access operation, data burst 311 typically has a length of 8 blocks (labeled 0/1/0-0/1/7) that are each an 8-byte block of data, thus resulting in burst 311 containing 64 bytes of data for the third memory access operation (read or rite to/from the specified address).

As the example of FIG. 3 illustrates, rather than waiting for the data burst 308 for a first memory access operation to complete before providing the address/control information for the next memory access operation to be performed, the tiling technique uses the address/control channel 303 to effectively schedule the data bursts for different memory access operations back-to-back, thereby maintaining high bandwidth utilization on the data channel 304.

As also illustrated in FIG. 3, traditionally the data channel 205 of a DIMM carries a 64-byte burst of data for each memory access operation requested. Some DIMMs can support 64-byte or 32-byte accesses. That is, some DIMMs may be configured into either a 64-byte access or a 32-byte access mode. Thus, memory bandwidth may be conserved to some extent for certain memory access operations by performing a 32-byte access of the DIMM, rather than a 64-byte access (if the operation only requires access of 32 or fewer bytes).

However, the full burst of either 32-bytes or 64-bytes is utilized for a single memory access operation.

In certain implementations, a plurality of DIMMs may share an address/control channel, and each DIMM may provide a separate data channel, wherein tiling may be employed on the address/control channel to maintain high bandwidth utilization on both data channels of the DIMMs. However, in these implementations, each DIMM provides only a single data channel.

As is well-known in the art, memory is often arranged into independently controllable arrays, often referred to as "memory banks." Under the control of a memory controller, a bank can generally operate on one transaction at a time. As mentioned above, the memory may be implemented by dynamic storage technology (such as "DRAMS"), or of static RAM technology. In a typical DRAM chip, some number (e.g., 4, 8, and possibly 16) of banks of memory may be present. A memory interleaving scheme may be desired to minimize one of the banks of memory from being a "hot spot" of the memory.

In most systems, memory 101 may hold both programs and data. Each has unique characteristics pertinent to memory performance. For example, when a program is being executed, memory traffic is typically characterized as a series of sequential reads. On the other hand, When a data structure is being accessed, memory traffic is usually characterized by a stride, i.e., the difference in address from a previous access. A stride may be random or fixed. For example, repeatedly accessing a data element in an array may result in a fixed stride of two. As is well-known in the art, a lot of algorithms have a power of 2 stride. This power of 2 stride gives rise to an increase in occurrences of bank conflicts because the power of 2 stride ends up accessing the same bank repeatedly. Accordingly, without some memory interleave management scheme being employed, hot spots may be encountered within the memory in which a common portion of memory (e.g., a given bank of memory) is accessed much more often than other portions of memory.

As discussed above, many compute devices, such as the Intel x86 or AMD x86 microprocessors, are cache-block oriented. Today, a cache block of 64 bytes in size is typical, but compute devices may be implemented with other cache block sizes. A cache block is typically contained all on a single hardware memory storage element, such as a single dual in-line memory module (DIMM). As discussed above, when the cache-block oriented compute device accesses that DIMM, it presents one address and is returned the entire cache-block (e.g., 64 bytes), as in the exemplary data bursts 308 and 311 discussed above with FIG. 3.

Some compute devices, such as certain accelerator compute devices, may not be cache-block oriented. That is, those non-cache-block oriented compute devices may access portions of memory (e.g., words) on a much smaller, finer granularity than is accessed by the cache-block oriented compute devices. For instance, while a typical cache-block oriented compute device may access a cache block of 64 bytes for a single memory access request, a non-cache-block oriented compute device may desire to access a Word that is 8 bytes in size in a single memory access request. That is, the non-cache-block compute device in this example may desire to access a particular memory DIMM and only obtain 8 bytes from a particular address present in the DIMM.

As discussed above, traditional multi-processor systems have employed homogeneous compute devices (e.g., processor cores 104A and 104B of FIG. 1) that each access memory 101 in a common manner, such as via cache-block oriented accesses. While some systems may further include certain heterogeneous compute elements, such as accelerators (e.g., a CPU), the heterogeneous compute element does not share the same physical or virtual address space of the homogeneous compute elements. Accordingly, traditional memory interleave schemes have not attempted to address an interleave of memory accesses across heterogeneous compute elements, which may access memory in different ways, such as via cache-block and non-cache-block accesses.

U.S. Patent Application Publication No. 2007/0266206 to Kim et al. (hereinafter "Kim") proposes a scatter-gather intelligent memory architecture. Kim mentions that to avoid wasting memory bandwidth, the scatter/gather engine supports both cache line size data accesses and smaller, sub-cache line accesses. However, Kim does not appear to describe its memory architecture in detail. One of ordinary skill in the art would thus suppose that Kim may be employing the above-mentioned traditional DIMMs, which enable either a full cache line (e.g., 64 bytes) or a sub-cache line (e.g., 32 bytes) access. However, as with the traditional DIMMs, only a single data channel per DIMM appears to be supported. Kim does not appear to provide any disclosure of a DIMM architecture that provides more than a single data channel per DIMM.

SUMMARY

The present invention is directed generally to systems and methods which provide a memory module having multiple data channels that are independently accessible (i.e., a multi-data channel memory module). According to one embodiment, the multi-data channel memory module enables a plurality of independent sub-cache-block accesses to be serviced simultaneously. In addition, the memory architecture also supports cache-block accesses. For instance, multiple ones of the data channels may be employed for servicing a cache-block access. In certain embodiments, the memory module is a scatter/gather dual in-line memory module (DIMM).

Thus, in one embodiment a DIMM architecture that comprises multiple data channels is provided. Each data channel supports a sub-cache-block access, and multiple ones of the data channels may be used for supporting a cache-block access. The plurality of data channels to a given DIMM may be used simultaneously to support different, independent operations (or access requests).

According to one exemplary embodiment, a memory module (e.g., DIMM) comprises eight 8-byte data access channels. Thus, eight 8-byte accesses can be performed in parallel on the given memory module. As an example, a first of the access channels may be performing a read access of a sub-cache-block of data, while another of the access channels may be simultaneously performing a write access of a sub-cache-block of data.

Thus, instead of having a single 64-byte access bus (or data channel) for the memory module, as with traditional DIMMs, in certain embodiments the access bus (or data channel) is partitioned into 8 independent 8-byte sub-buses (which may also be referred to as channels, paths, or lanes). An address and a request type is independently supported for each of the 8-byte sub-buses individually. Accordingly, in certain embodiments, one may think of the traditional DIMM data channel as being divided into multiple sub-buses, which may be referred to as data paths or lanes. Of course, because each of these sub-buses are independently accessible (e.g., for supporting independent memory access operations), they are similar to separate data channels, rather than being smaller portions (e.g., "lanes") of a larger overall data channel. As such, the sub-buses may be referred to herein as separate data channels, data lanes, or data paths, and each of these terms is intended to have the same meaning, effectively providing for multiple, independently accessible data channels (which may each support a sub-cache-block access of data) for a memory module.

As discussed further hereafter, the 8 independent sub-buses may be used to simultaneously support different sub-cache-block accesses. Additionally, multiple ones of the independent sub-buses may be employed to satisfy a cache-block access. For instance, the eight 8-byte sub-buses may be used to satisfy a full 64-byte cache-block access. As further discussed hereafter, in certain embodiments the cache-block and sub-cache-block accesses may be intermingled such that all eight of the 8-byte data channels need not be reserved for simultaneous use in satisfying a cache-block access. Rather, in certain embodiments, the cache-block access may be satisfied by the channels within a window of time, wherein logic (e.g., a memory controller) may receive the cache-block data within the window of time and bundle the received data into a cache-block of data for satisfying a cache-block access request.

According to one embodiment, the traditional 64-byte data channel of a DIMM (such as the exemplary data channel 205 discussed above with FIG. 2) is partitioned into a plurality of "lanes" such that the bandwidth of the traditional data channel is leveraged to support multiple independent sub-cache-block accesses. For instance, in one embodiment, the 64-bit wide data path of a traditional DIMM is partitioned into eight 8-bit wide paths that each have independent control. As an example, in one embodiment, each lane is 8 bits (1-byte) wide, wherein each data access comprises a "burst" length of 8, thus resulting in each data lane carrying 8 bytes for each access. Thus, the traditional 64-byte data channel of a DIMM (such as that discussed above in FIG. 2) is, in one embodiment, effectively divided into 8 independent data lanes that each support an independent access of 8 bytes. Accordingly, whereas a traditional data channel of FIG. 2 provides a 64-byte data burst for a given memory access operation (read or write), a DIMM according to one embodiment effectively sub-divides the traditional DIMM data channel to provide eight independent 8-byte data bursts for potentially supporting eight independent 8-byte access operations (read or write operations).

In one embodiment, when a sub-cache-block access (e.g., a single word) is requested, the address of the sub-cache-block to be accessed is supplied to one of the eight sub-buses (or data lanes) with a corresponding request type (e.g., read or write), and that sub-bus provides the sub-cache-block of data. The other seven 8-byte sub-buses can each independently be supporting other operations. On the other hand, when a cache block access (e.g., of 64-bytes) is requested, the same address and request type (e.g., either a read or write) may be supplied to all eight sub-buses. The eight sub-buses each returns their respective portion of the requested cache block so that the entire cache block is returned in a single burst by the eight sub-buses.

In certain embodiments, upon receiving a cache-block access request, the eight sub-buses may be reserved (to place any sub-cache-block access requests received thereafter "on hold" until the eight sub-buses are used for satisfying the cache-block access request), and the eight sub-buses may then be used simultaneously to fully, in one burst, satisfy the 64-byte cache-block access request. As discussed further hereafter, in other embodiments, no such reservation is employed, but instead the cache-block access request may be handled by the eight sub-buses along with an intermingling of any sub-cache-block access requests that might be present at that time, wherein the cache-block access may be satisfied by the sub-buses within a window of time, and the 64 bytes of the cache-block access returned by the sub-buses within the window of time may be bundled by logic (e.g., a memory controller) into the requested 64 byte cache block of data. Thus, rather than supplying the same address and request type (e.g., either a read or write) to all eight sub-buses simultaneously for satisfying a cache-block access request, in certain embodiments, such address and request type for the cache-block access may in a first instance be supplied to a portion of the eight sub-buses (which each returns their respective portion of the requested cache block) and in a later instance a further portion of the eight sub-buses may be supplied the address and request type in order to return the remaining portion of the requested cache block. The two portions of the cache block may then bundled together (e.g., by a memory controller) to form the requested cache block of data. In other words, rather than satisfying a cache-block access in a single burst of data, in certain embodiments portions of the cache-block of data may be returned over a plurality of bursts (e.g., with sub-cache-block bursts of data intermingled therewith), and the appropriate portions may be bundled together to form a congruent burst of cache-block data.

Thus, in certain embodiments, cache-block (e.g., 64-byte) accesses may be intermixed with sub-cache-block (e.g., 8-byte) accesses, and each 8-byte sub-bus (or "lane") of the memory module is scheduled independently to support the intermixing. Thus, a cache-block access may not necessarily be performed using all eight sub-buses simultaneously (such that the entire cache-block is returned in a single burst in the manner mentioned above), but instead, at a given time some of the eight 8-byte sub-buses may be used for performing a sub-cache-block access while some others of the eight 8-byte sub-buses are used for the cache-block access. Thus, the cache-block access may be returned within a window of time by the sub-buses, wherein a controller bundles the returned data into the requested cache-block.

In one embodiment, the memory module comprises control logic, such as a Field-Programmable Gate Array (FPGA), that manages decoding and multiplexing of address and control information for the plurality of data channels of the module. For instance, in certain embodiments, address and control information for memory access operations is communicated from a memory controller to the memory module via an external address/control channel. In certain embodiments, the address and control information is encoded according to a time multiplexed encoding scheme to enable address and control information for a plurality of independent memory access operations to be received over a communication time period (e.g., over two time units) in which address and control information for a single memory access operation is traditionally communicated. For instance, during the communication time period that is traditionally performed on an address/control channel for specifying the address and control information for a 64-byte memory access operation (e.g., read or write), the encoded address/control channel of certain embodiments carries information specifying the address and control information for a plurality of independent sub-cache-block data access operations (e.g., eight 8-byte data access operations).

The control logic receives the encoded address and control information and decodes that information to control the plurality of data channels for servicing the plurality of memory access operations specified in the received encoded address and control information. In certain embodiments, a plurality of internal address/control channels is employed within the memory module, which are used for controlling the plurality of data channels for servicing a plurality of independent memory access operations, as discussed further herein.

According to certain embodiments of the present invention, rather than servicing a single memory access operation over a traditional single memory access time period (e.g., an 8 time unit burst), multiple data channels are employed in a memory module (e.g., DIMM) to service a plurality of independent memory access operations over the same access time period. For instance, rather than carrying 64-bytes of data for a single memory access operation over an 8 time unit burst (e.g., 8 clock units or 8 clock phases), an embodiment of the multi-data channel memory module disclosed herein carries 8-bytes of data for each of a plurality of independent memory access operations over such an 8 time unit burst. Thus, according to one embodiment, over an access time period for carrying a cache-block of data (e.g., an 8 time unit burst of 64-bytes of data), the multi-data channel memory module carries a sub-cache-block of data for each of a plurality of independent memory access operations (e.g., carries 8-bytes of data for each of eight independent memory access operations).

Some computing systems are being developed that include heterogeneous compute elements that share a common physical and/or virtual address space of memory. As an example, a system may comprise one or more compute elements that are cache-block oriented, and the system may further comprise one or more compute elements that are non-cache-block oriented. For instance, the cache-block oriented compute element(s) may access main memory in cache blocks of, say, 64 bytes per request, whereas the non-cache-block oriented compute element(s) may access main memory via smaller-sized requests (which may be referred to as "sub-cache-block" requests), such as 8 bytes per request.

One exemplary heterogeneous computing system that may include one or more cache-block oriented compute elements and one or more non-cache-block oriented compute elements is that disclosed in co-pending U.S. patent application Ser. No. 11/841,406 filed Aug. 20, 2007 titled "MULTI-PROCESSOR SYSTEM HAVING AT LEAST ONE PROCESSOR THAT COMPRISES A DYNAMICALLY RECONFIGURABLE INSTRUCTION SET", the disclosure of which is incorporated herein by reference. For instance, in such a heterogeneous computing system, one or more processors may be cache-block oriented, while one or more other processors (e.g., the processor described as comprising a dynamically reconfigurable instruction set) may be non-cache-block oriented, and the heterogeneous processors share access to the common main memory (and share a common physical and virtual address space of the memory).

Accordingly, a desire has arisen for an efficient memory architecture for supporting differently sized memory access requests, such as the above-mentioned cache-block accesses and sub-cache-block accesses. Such an improved memory architecture is desired, for example, for use in computing systems that may include one or more cache-block oriented compute elements and one or more non-cache-block oriented compute elements. While the exemplary heterogeneous computing system disclosed in U.S. patent application Ser. No. 11/841,406 filed Aug. 20, 2007 titled "MULTI-PROCESSOR SYSTEM HAVING AT LEAST ONE PROCESSOR THAT COMPRISES A DYNAMICALLY RECONFIGURABLE INSTRUCTION SET" is one example of a system for which an improved memory architecture may be desired, embodiments of the improved multi-data channel memory module architecture described herein are not limited for use with that heterogeneous computing system, but may likewise be applied to various other types of heterogeneous computing systems in which cache-block oriented and non-cache-block oriented compute elements (e.g., processors) share access to a common memory. In addition, embodiments may likewise be used within homogeneous computing systems.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 4:
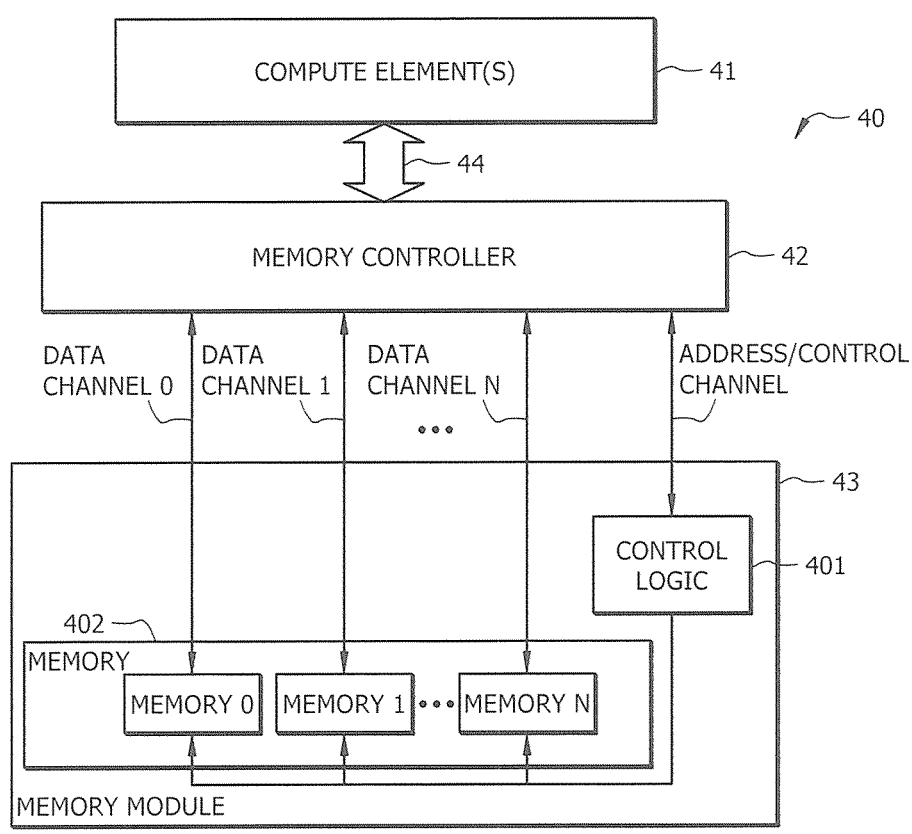
FIG. 4 shows an exemplary system according to one embodiment of the present invention.

Turning to FIG. 4, a block diagram of an exemplary system 40 according to one embodiment of the present invention is shown. System 40 comprises compute element(s) 41, memory controller 42, and a memory module (e.g., DIMM) 43. Memory module 43 comprises multiple, independently controlled data channels (data channels 0-N), and may thus be referred to as a multi-data channel memory module. As discussed above, the multiple, independently controlled data channels may, in some embodiments, be formed by partitioning the single data channel of a traditional DIMM into multiple, independently controlled data channels. For instance, instead of having a single 64-byte data channel for the memory module, as with traditional DIMMs, in certain embodiments the data channel is partitioned into eight independent 8-byte data channels (which may also be referred to as paths or lanes). An address and a request type is independently supported for each of the 8-byte data channels 0-N individually. Thus, as discussed further hereafter, the independent data channels 0-N may be used to support independent sub-cache-block accesses.

Figure 1:
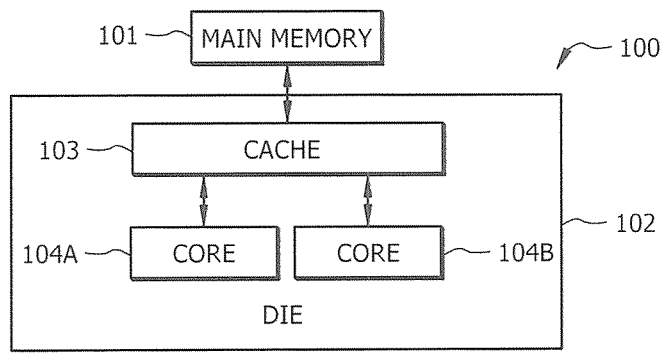
FIG. 1 shows a block diagram of an exemplary system architecture of the prior art.

The combination of elements 41-43 permit programs to be executed, i.e. instructions are executed in compute element(s) 41 to process data stored in memory 402 of memory module 403. Compute element(s) 41 may be processors (e.g., processor cores) or other functional units. Compute element(s) 41 may comprise a plurality of compute elements, such as processor cores 104A and 104B of FIG. 1. In certain embodiments, such compute element(s) 41 comprise heterogeneous compute elements, as discussed further herein. For instance, such compute elements may be heterogeneous in that they access memory 402 of memory module 43 in different ways, such as via cache-block and sub-cache-block accesses. In addition, the heterogeneous compute elements may comprise different instruction sets in certain embodiments. In other embodiments, compute element(s) 41 may be homogeneous compute elements that have the same instruction sets.

Compute element(s) 41 request access to memory module 43 via bus 44. Memory controller 42 may receive such request and control assignment of the request to an appropriate portion of memory, such as to one of a plurality of memory modules 43 that may be implemented (only one memory module is illustrated for ease of discussion in FIG. 4, but a plurality of such modules may be present in a given system, just as a plurality of DIMMs are commonly employed for implementing main memory of computing systems).

In the exemplary embodiment of FIG. 4, memory module 43 comprises an address/control channel and a plurality of data channels, shown as data channel 0-data channel N. As shown, the address/control channel and data channels are employed for communication between memory controller 42 and memory module 43. In general, the address/control channel specifies addresses and a desired type of accesses (e.g., reads or writes) for memory access operations, and the data channels carry the corresponding data to/from the specified addresses for performing the desired type of accesses. For instance, a row select command and column access command for memory access requests are communicated via the address/control channel, and data for a memory access operation (e.g., data to be read from memory or data to be written to memory) is carried on the data channels.

In this exemplary embodiment, memory module 43 comprises control logic (e.g., an FPGA, ASIC, etc.) 401, as well as memory (data storage) 402. The memory 402 may be implemented by one or more memories (shown as Memory 0-Memory N), such as DRAMs (Dynamic Random Access Memory), for example, as is commonly employed in DIMMs. In one embodiment, memory module (e.g., DIMM) 43 comprises eight independent data channels, wherein each of the eight independent data channels supports a sub-cache data access. For instance, in one embodiment, each of the eight independent data channels supports a 8-byte burst of data for a corresponding memory access operation. As an example, each of the data channels may be implemented as 1-byte in width and employed for each memory access for supplying a data burst of length 8 (8 time units, such as 8 clock cycles or 8 phases of a clock), thus resulting in an 8-byte burst of data.

Figure 2:
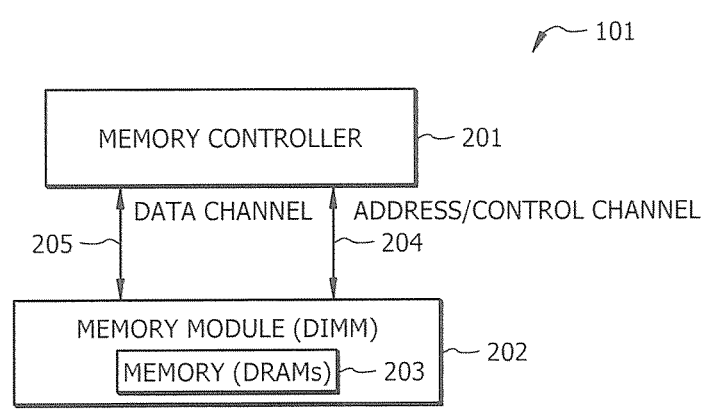
FIG. 2 shows a block diagram of an exemplary memory system of the prior art.

For instance, in one embodiment, the 64-bit wide data path of a traditional DIMM is partitioned into eight 8-bit wide paths (i.e., data channels 0-N of FIG. 4) that each have independent control. As an example, in one embodiment, each of data channels 0-N is 8 bits (1-byte) wide, wherein each data access comprises a "burst" length of 8, thus resulting in each data channel 0-N carrying 8 bytes for each access. Thus, the traditional 64-byte data channel of a DIMM (such as that discussed above in FIG. 2) is, in one embodiment, effectively divided into eight independent data channels that each support an independent access of 8 bytes. Accordingly, whereas a traditional data channel of FIG. 2 provides a 64-byte data burst for a given memory access operation (read or write), an exemplary implementation of DIMM 43 according to one embodiment effectively sub-divides the traditional DIMM data channel to provide eight independent 8-byte data bursts for potentially supporting eight independent 8-byte access operations (read or write operations).

Further, independent memory access operations may be supported in parallel on the different data channels 0-N of FIG. 4. For instance, in the above-mentioned exemplary embodiment in which eight data channels are implemented, eight 8-byte data accesses can be performed in parallel on the given memory module 43. An exemplary technique for tiling the accesses of the multiple data channels of a DIMM according to one embodiment is described further hereafter with FIG. 7.

Figure 5:
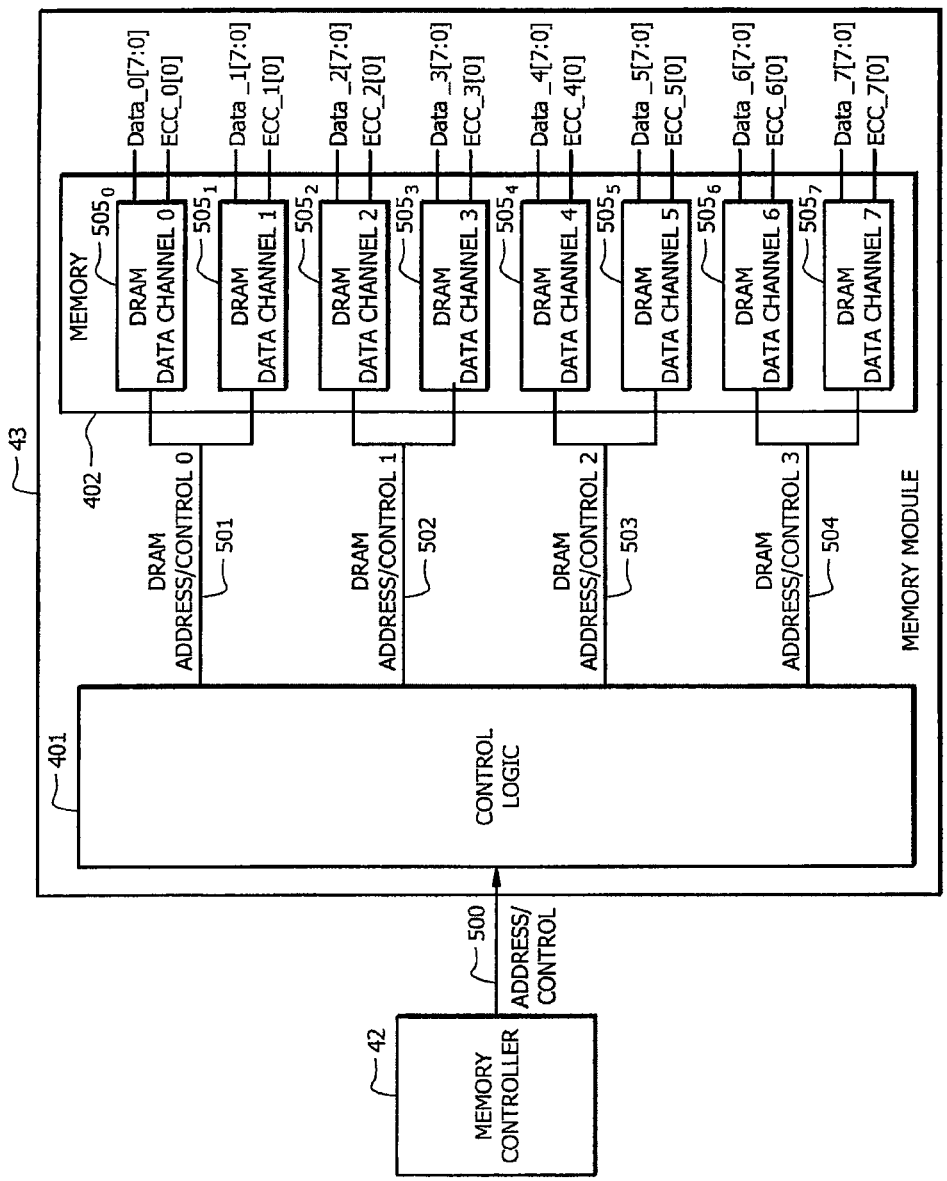
FIG. 5 shows a block diagram of an exemplary memory system according to one embodiment of the present invention.

FIG. 5 shows a block diagram of an exemplary implementation of a memory module according to one embodiment of the present invention. As discussed above with FIG. 4, memory module 43 includes control logic 401 that receives address/control information from memory controller 42 via an address/control channel. In this example, control logic 401 is operable to multiplex the received address/control information into multiple internal address/control channels, shown as address/control channels 501-504 in the example of FIG. 5. Each of the internal address/control channels 501-504 is used for supplying address/control information for two data channels. For instance, tiling may be employed to enable 2 groups of DRAMs to share one control/address bus at full data bandwidth for both. Thus, in the illustrated example, the address and control signals are organized on the memory module (e.g., DIMM) 43 into 4 groups (e.g., groups 501-504), each serving two data channels. DRAMs are implemented for providing the data for eight data channels, shown as data channels $505_0$-$505_7$. As shown, in this example each data channel has a data width of 8 bits (i.e., data [7:0]), and includes a bit for error correction code (ECC[0]).

Figure 3:
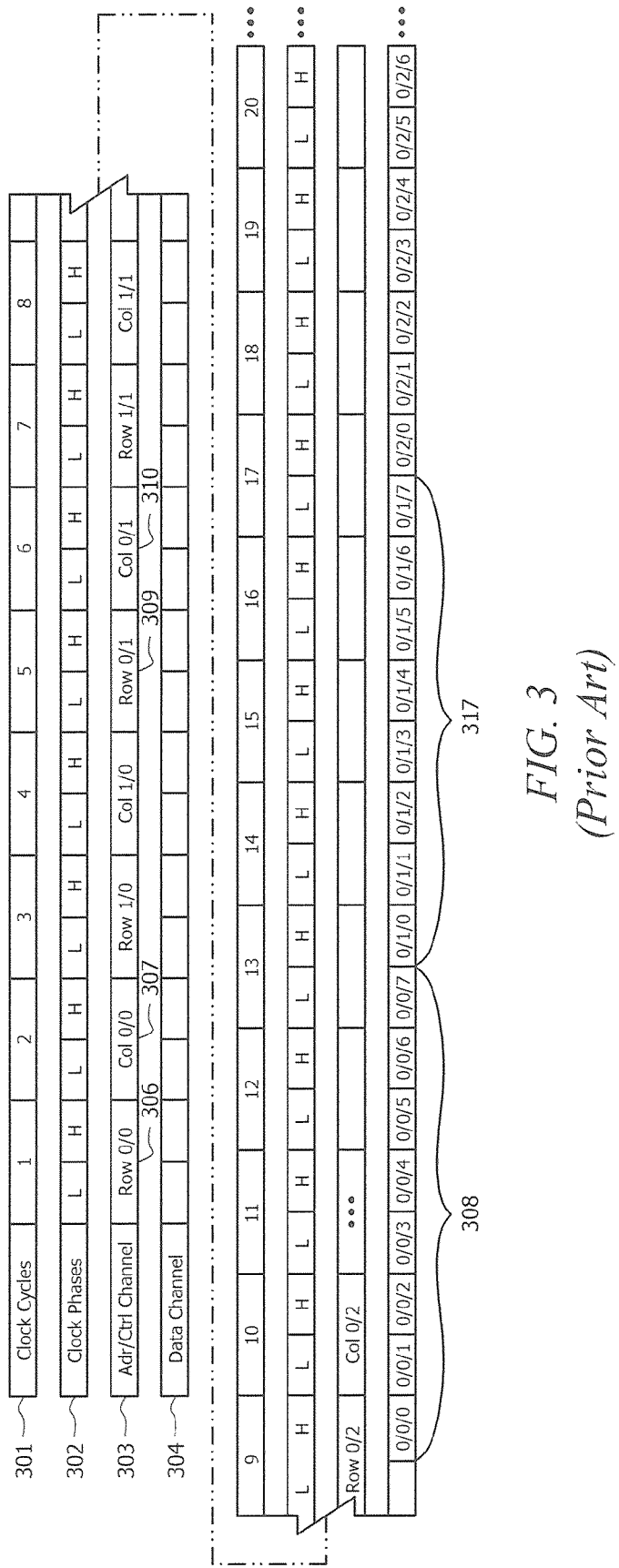
FIG. 3 shows an exemplary tiling of memory access operations of the prior art.

Thus, in the exemplary implementation of FIG. 5, memory controller 42 sends address/control commands to control logic 401 over address/control channel 500. In certain embodiments, address/control channel 500 corresponds to the address/control channel of traditional DIMMs, such as address/control channel 204 of FIG. 2. As an example, when implemented according to the traditional JEDEC standard (see www.jedec.org), the address/control channel has a width of 32 bits, and communicates address/control commands for a given memory access operation over two time units (e.g., two clock cycles). For instance, as discussed in the example of FIG. 3, the row select command and column access command for a single memory access operation is traditionally communicated on the address/control channel over two time units (i.e., two clock cycles in that example). The address and control information that is commonly communicated over such an address/control channel 204 is well-known in the art, and those of ordinary skill in the art should therefore recognize what information may be contained in such address/control information for a given memory access operation.

However, in the exemplary embodiment of FIG. 5, the address/control commands for a plurality of independent memory access operations are combined so as to be communicated in a time period (e.g., over two time units) during which a traditional DIMM communicates address and control commands for a single memory access operation. In this embodiment, during the time period in which address/control channel 204 traditionally communicates the address and control commands for a 64-byte data access operation (e.g., read or write), address/control channel 500 carries information specifying the address and control commands for a plurality of independent sub-cache-block data access operations (e.g., eight 8-byte data access operations).

In the example of FIG. 5, a time multiplexed encoding scheme is used on the address/control information communicated over channel 500. First, the address and control information (e.g., the row select and column access commands) are encoded into a single command, which provides a 2:1 time reduction. One exemplary technique that may be employed for such encoding of the row select and column access commands into a single command is briefly described below.

In general, DRAM accesses include a sequence of operations presented to the DRAM via the collection of signals/commands on the address/control channel. These signals typically include Address/AP, Bank Address, CMD (RAS, CAS and WE), Adr/Cmd Parity, ODT and CS. A typical access sequence includes a bank activate (row select) command followed by a column read or column write command. Successive commands to the same row typically only require a column read or column write command. Before accessing another row on the same bank (or within a defined time limit), the row typically must be closed and precharged using the precharge command. If a single access to a row is anticipated, the precharge may be combined with the column access command by issuing a read or write with the auto-precharge bit set. Several of the signals are redundant or partially used in one DRAM command or the other. For example, the Bank Address bits are the same in both row and column operations and the column address does not use all of the address bits.

Standard DIMMs export the above-mentioned DRAM signals to the DIMM interface to the memory controller. The memory controller is responsible for issuing the row select (or bank activate) and column access commands with the correct sequence and timing along with the necessary precharge operations.

According to one embodiment, the typical row select and column access commands sent to the DRAM are combined into a single command sent from the memory controller to the DIMM. Further, according to one embodiment, this is achieved using the same total number of address and control pins as on the standard DIMM, but the address and control pins are redefined to carry the encoded address/control information. The resulting address sent to the DIMM includes both the row and column addresses in a single 27-bit field.

In one embodiment, some simplifications are enforced on the memory controller's use of commands to allow the DIMM control logic to infer the correct sequencing of DRAM operations from the encoded DIMM commands, using fewer total command bits. For example, in one embodiment, a row is never left open, which implies that the DIMM control logic drives the auto-precharge bit on every column access command. While this precludes accessing a second column address on an open row, the type of non-sequential access patterns for which one embodiment of the DIMM is optimizing makes it unlikely that a subsequent access to a DRAM bank will be to the same row. An advantage gained from doing this is that no more than one DIMM command cycle is ever needed to tell the DIMM control logic what sequence of operations to perform. Also, the precharge bit is not required to be sent from the memory controller to the DIMM. The commands sent to the DIMM in one embodiment indicate Read, Write, Refresh, Precharge and Mode Register Select. Row activation is inferred from a read or write command.

In one embodiment, the time between row select and column access commands is controlled by the DIMM control logic, rather than the memory controller. This allows control of the ODT signals to be moved from the memory controller into the DIMM control logic, saving these 2 signals on the DIMM interface. In addition, multiple ranks can be supported using fewer control bits by encoding the chip select and clock enable signals as well, using 3 bits to carry the information normally carried by 4 chip select and 2 CKE signals.

Examples of column write and read operations for both a standard DIMM and one exemplary implementation of the multi-data-channel DIMM are shown below for a 256 Mb x8 DDR2 DRAM.

Standard DIMM column write example (30 signals):
  Row Activate Command:

RAS,CAS,WE = 011 (ACTIVATE)
BA<2:0> = bank number
A<15:0> = row address
CKE<1:0> = clock enables - always active other than during initialization sequence
CS<3:0> = chip select - only 1 bit active
ODT<1:0> = On-Die Termination, controlled by MC Column Write Command:

RAS, CAS, WE = 100 (WRITE)
BA<2:0> = bank number (same as activate)
A<15:0> = column address (only 10 or 11 bits used)
CKE<1:0> = clock enables - always active other than during initialization sequence
CS<3:0> = chip select - only 1 bit active
ODT<1:0> = On-Die Termination, controlled by MC One implementation of a multi-data-channel DIMM write command example (36 signals):
  Write Command:

RAS, CAS, WE = 100 (WRITE, implied Activate & Auto-Precharge)
BA<2:0> = bank number
A<26:0> = Row + column address
CKE<0> = clock enable - always active other than during initialization sequence
CS<1:0> = chip select - encoded In one exemplary implementation of the multi-data-channel DIMM, additional DIMM ACTL signals are obtained from a combination of unused strobe and DM signals, reserved and NC pins on the JEDEC DIMM definition. The unused strobe and DM signals are a result of the way the data and check (ECC) bits are allocated into 8 groups of 8-bit data+check bits instead of 9 groups of 8 bits, each group having strobe and DM bits assigned to it. There are multiple ways the standard DIMM pins could be partitioned to accomplish the same results.

Additionally, dual data rate (DDR) signaling is employed, in this example, to provide another factor of two bandwidth increase. Thus, this results in four times the address control bandwidth on channel 500 as compared to a standard DIMM address/control channel 204 (according to the JEDEC standard). Tiling provides an additional factor of two to allow the single address/control channel 500 to keep up with eight data channels. An exemplary tiling scheme that may be employed is discussed further hereafter with FIG. 7.

The single address/control channel 500, in FIG. 5, is received by control logic 401 of memory module 43, which decodes the received address/control information into information for a plurality of different DRAM address/control channels 501-504. In the illustrated example, the address/control information received via address/control channel 500 is decoded by control logic 401 into corresponding information for four independent address/control channels, 501-504, that are employed within memory module 43. Because address/control channel 500 is used for external communication of the memory module 43 (i.e., from memory controller 42), such address/control channel 500 may be referred to as an external address/control channel, whereas DRAM address/control channels 501-504 may be referred to as internal address/control channels because they are used for internal communication within memory module 43. Each of the DRAM address/control channels 501-504 carries the DRAM address and control signals such as is expected by a DRAM (e.g., according to the DRAM's specification sheet). So, control logic 401 is operable to split the encoded, DDR address/control information received via address/control channel 500 into four separate DRAM address/control channels 501-504 in accordance with command timing that the individual DRAMs expect to see. By employing tiling in this example, each of the DRAM address/control channels 501-504 is used for carrying address and control information for two different data channels. For instance, a given DRAM address/control channel (e.g., channel 501) may communicate address and control information for a first memory access operation to a first data channel (e.g., data channel $505_0$) during a first time period (e.g., two clock cycles), and then the given DRAM address/control channel (e.g., channel 501) may communicate address and control information for a second memory access operation to a second data channel (e.g., data channel $505_1$) during a second time period.

A typical DIMM has a single data channel that is 8 bytes wide of data and byte wide of error correction code (ECC), and each memory access reads out a burst of 8 words to result in the data channel carrying 64 bytes of data plus 8 bytes of ECC for a given memory access operation. The exemplary implementation of FIG. 5 spreads the 8 bits of ECC per word across each of the plurality of data channels $505_0$-$505_7$. So, each data channel $505_0$-$505_7$ has a single ECC bit and 8 data bits. So, over a burst of 8 time units (e.g., 8 clock phases), each data channel provides one 8-byte data word and a 1-byte ECC word that allows for single-bit error correction and double-bit error detection using standard error correction coding. Thus, together the data channels $505_0$-$505_7$, over a burst of time units (e.g., 8 clock phases) provide the 64-bytes of data and 8-bytes of ECC, as is typically expected in a standard DIMM. However, as discussed further herein, embodiments of the present invention enable each of the multiple data channels to be servicing independent memory access operations. Thus, in the example of FIG. 5, the data paths are organized to provide independent access to eight data channels (or "lanes") $505_0$-$505_7$, each providing a byte-wide data path with 1 ECC bit. As discussed further herein, each DRAM is accessed, in this exemplary embodiment, with a burst length of 8, thus providing 8 data bytes and 1 check byte per access, per data channel.

Thus, rather than servicing a single memory access operation over a traditional single memory access time period (e.g., an 8 time unit burst), multiple data channels are employed in embodiments of the present invention to service a plurality of independent memory access operations over the same access time period. For instance, rather than carrying 64-bytes of data for a single memory access operation over an 8 time unit burst (e.g., 8 clock units or 8 clock phases), an embodiment of the multi-data channel memory module disclosed herein carries 8-bytes of data for each of a plurality of independent memory access operations over such an 8 time unit burst. Thus, according to one embodiment, over an access time period for carrying a cache-block of data (e.g., an 8 time unit burst of 64-bytes of data), the multi-data channel memory module carries a sub-cache-block of data for each of a plurality of independent memory access operations (e.g., carries 8-bytes of data for each of eight independent memory access operations).

Figure 6:
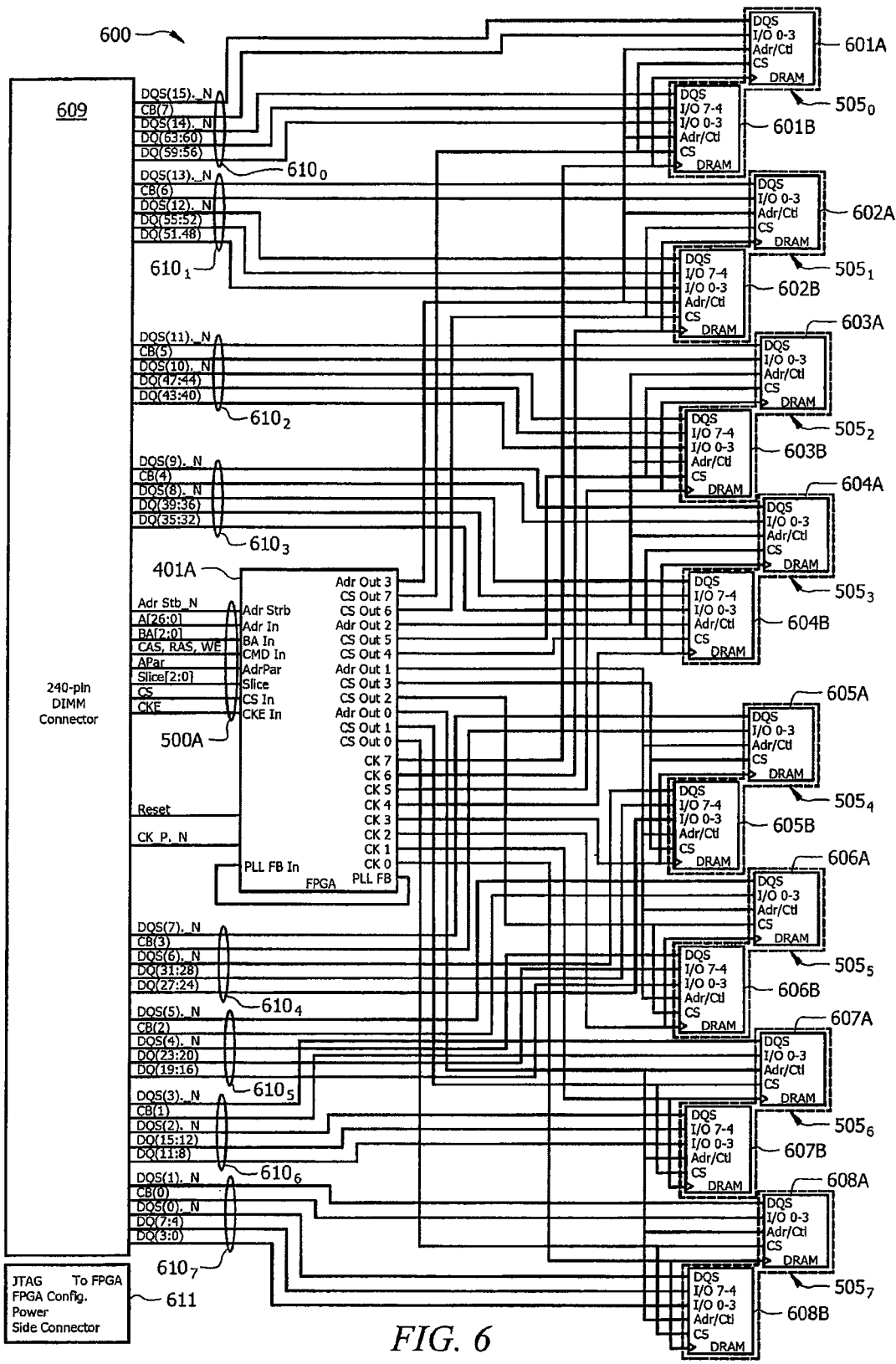
FIG. 6 shows an exemplary simplified schematic of a DIMM implemented in accordance with one embodiment of the present invention.

Turning to FIG. 6, an exemplary diagram of a DIMM 600 implemented according to one embodiment of the present invention is shown. DIMM 600 comprises an FPGA 401A, which receives control/address commands 500A and decodes such received control/address commands into commands for four independent DRAM control/address channels 501-504 (as shown in FIG. 5 above). As discussed further hereafter, the integrated control element (e.g., FPGA 401A) is included on DIMM 600 to implement address and control command decoding and sequencing, registering and fanout, and clock distribution. While an FPGA 401A is shown in the example of FIG. 6, in certain embodiments an ASIC or other control logic for performing the operations described may be implemented instead.

In this implementation, data channels $505_0$-$505_7$ are each implemented with one DRAM for providing a bit of ECC and one DRAM for providing 8 bits of data. For instance, data channel $505_0$ is formed by a first DRAM 601A that provides a bit of ECC and a second DRAM 601B that provides 8 bits of data (I/O 7-4 and I/O 3-0). Data channels 5051-5057 are similarly formed by first DRAMs 602A-608A that each provides a bit of ECC and second DRAMs 602B-608B that each provides 8 bits of data, as shown. The DRAMs thus provide eight, independent data channels $610_0$-$610_7$, which correspond to data channels 0-N in the example of FIG. 4.

In the example of FIG. 6, DIMM 600 is a packaged module that can be connected to a computer system in place of a standard DIMM module. For instance, DIMM 600 in this example has a standard 240-pin connector 609, as is traditionally employed for DIMMs of the prior art. In certain embodiments, an interface is provided for programming FPGA 401A. Of course, in certain implementations, a persistent image may be stored locally on DIMM 600 and loaded to FPGA 401A, rather than programming FPGA 401A from an external source. Alternatively, in certain embodiments an ASIC or other control logic other than an FPGA may be implemented on DIMM 600 for performing the operations described herein for such control logic. However, in the example of FIG. 6, an additional connector, such as side connector 611, is provided to enable an external source to connect to FPGA 401A for programming such FPGA 401A for performing the control logic operations described herein. Thus, in the illustrated example of FIG. 6, a sideband connector 611 is used to provide a path for FPGA programming and voltages to the DIMM 600. This connector 611 is unused on the motherboard if a standard JEDEC DIMM is used. Further, as mentioned above, the connector 611 may be eliminated if an ASIC is used for the control logic on the DIMM 600 instead of an FPGA 401A. As another example, in certain embodiments the connector 611 may be eliminated by combining use of certain signals available via connector 609 to perform the dual purpose of programming FPGA 401A in addition to their normal use.

The exemplary embodiment of DIMM 600 in FIG. 6 maintains socket level compatibility with standard DDR2 RDIMM (240-pin socket), organized as 64 data bits, 8 check bits (ECC) and a single set of address, control and clock/strobe signals per JEDEC spec. Further, the exemplary embodiment of FIG. 6 may be implemented to fit within the mechanical and thermal envelope of a standard DDR2 RDIMM. This exemplary embodiment of FIG. 6 maps all signals to the same memory controller pins as for a standard DIMM solution. Additionally, this exemplary embodiment includes sufficient ECC bits for error correction of single bit errors and error detection of double bit errors. Further, the exemplary embodiment of FIG. 6 may be implemented using commodity DRAMs, which provides a cost savings for the module.

Figure 7:
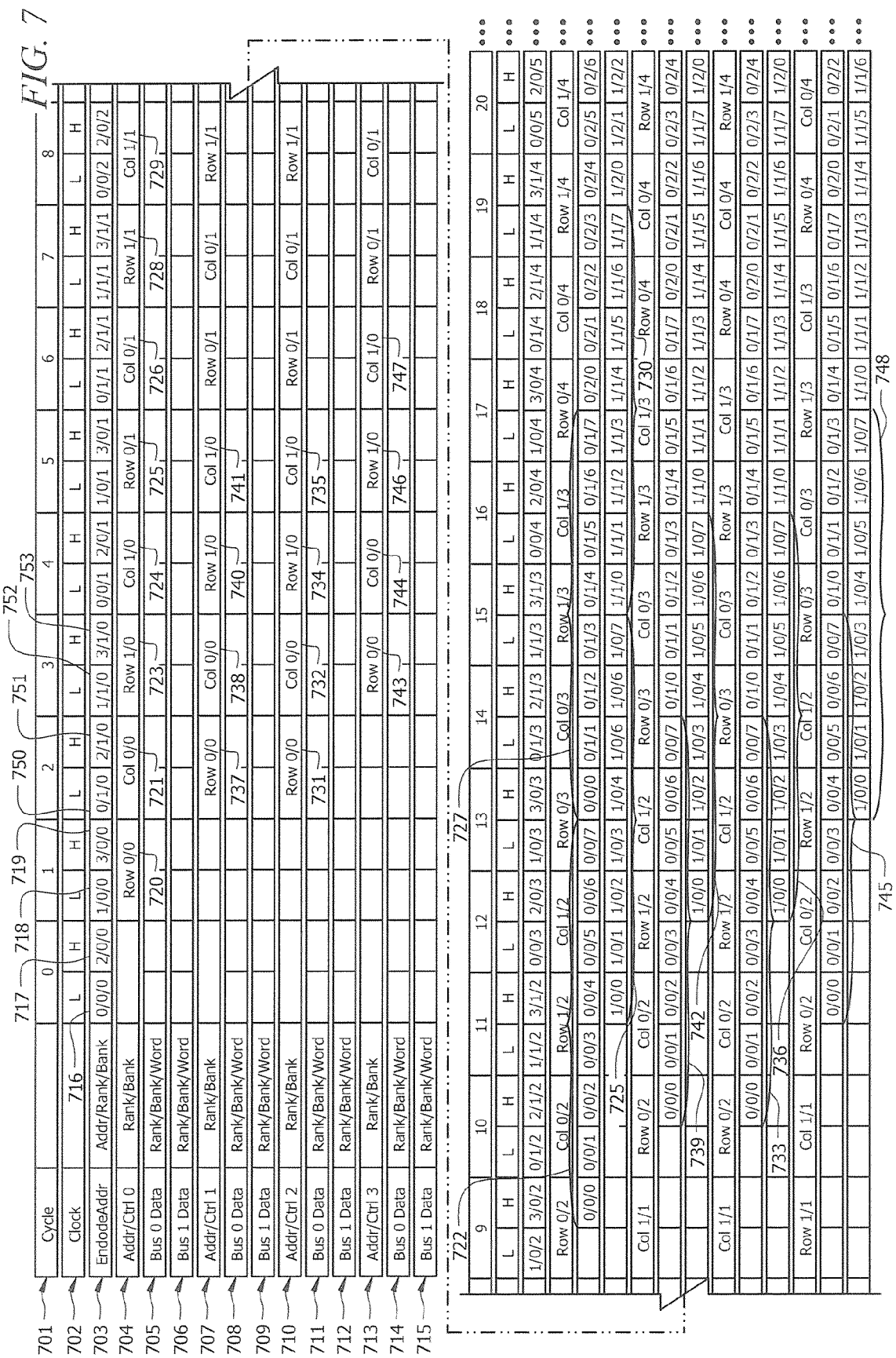
FIG. 7 shows an exemplary tiling of memory access operations according to one embodiment of the present invention.

As discussed above, to improve data channel bandwidth, tiling may be employed. FIG. 7 shows an example of a tiling technique employed according to one embodiment of the present invention. FIG. 7 shows clock cycles 701 of a reference clock signal, wherein the illustrated example shows 20 clock cycles numbered 1-20. Clock phases 702 is also shown, wherein for each clock cycle the clock has a low phase ("L") and a high phase ("H"), as is well known. An external address/control channel, such as channel 500 of FIG. 5, is shown as encoded address/control channel 703. As discussed above with FIG. 6, preferably the address and control commands are communicated over the external address/control channel 703 according to a time multiplexed encoding scheme. Thus, FIG. 7 shows an example of address/control commands received by control logic 401 from memory controller 42 via address/control channel 500.

Also, in this example, four internal DRAM address/control channels are shown as channels 704, 707, 710, and 713, which correspond to the internal address/control channels 501-504 of FIG. 5. As discussed above with FIG. 5, control logic 401 decodes the address and control commands received via encoded address/control channel 703 (channel 500 of FIG. 5) to produce the address and control commands for each of the four internal address/control channels 704, 707, 710, and 713 (channels 501-504 of FIG. 5), as discussed further hereafter.

As discussed in the examples of FIGS. 5 and 6 above, each of the internal address/control channels 704, 707, 710, and 713 (channels 501-504 of FIG. 5) may support address and control commands for two different data channels. Thus, in FIG. 7 a first data channel 705 and a second data channel 706 carry data as specified by the address and control commands supplied by first internal address/control channel 704. Thus, first internal address/control channel 704 may correspond to internal address/control channel 501 of FIG. 5, and data channels 705 and 706 may correspond to data channels $505_0$-$505_1$ of FIG. 5.

Also, in FIG. 7 a third data channel 708 and a fourth data channel 709 carry data as specified by the address and control commands supplied by second internal address/control channel 707. Thus, second internal address/control channel 707 may correspond to internal address/control channel 502 of FIG. 5, and data channels 708 and 709 may correspond to data channels $505_2$-$505_3$ of FIG. 5. Similarly, a fifth data channel 711 and a sixth data channel 712 carry data as specified by the address and control commands supplied by third internal address/control channel 710 (e.g., the third internal address/control channel 710 may correspond to internal address/control channel 503 of FIG. 5, and data channels 711 and 712 may correspond to data channels $505_4$-$505_5$ of FIG. 5).

Finally, in FIG. 7, a seventh data channel 714 and an eighth data channel 715 carry data as specified by the address and control commands supplied by fourth internal address/control channel 713 (e.g., fourth internal address/control channel 713 may correspond to internal address/control channel 504 of FIG. 5, and data channels 714 and 715 may correspond to data channels $505_6$-$505_7$ of FIG. 5).

In the illustrated example of FIG. 7, in the low phase of clock cycle 0, encoded address/control command 716 is received by control logic 401 (of FIG. 5) via address/control channel 703. Control logic 401 decodes the received command 716 to produce the address and control commands for internal address/control channel 704 (e.g., internal address/control channel 501 of FIG. 5). In this example, the address and control command 716 received by control logic 401 can be decoded to produce both a row select command and a column access command for a memory access operation. Thus, as a result of such decoding, control logic 401 places row select command 720 for a first memory access operation on internal address/control channel 704 in clock cycle 1, and places column access command 721 for the first memory access operation on internal address/control channel 704 in clock cycle 2.

After a predefined delay (the DRAM's data access delay), data channel 705 carries the data "burst" for the first memory access operation. For instance, beginning in the high phase of clock cycle 9 and ending in the low phase of clock cycle 13, data burst 722 carries the data for the first memory access operation. In this exemplary implementation, data burst 722 caries 8-bytes of data for the first memory access operation. For instance, data channel 705 is implemented as an 8-bit (1-byte) wide channel, wherein each memory access comprises a "burst" length of 8 time units (e.g., clock phases), thus resulting in the data channel carrying 8 bytes of data for each access. For instance, each of the 8 blocks of burst 722 (labeled 0/0/0-0/0/7) may be a 1-byte block of data, thus resulting in burst 722 containing 8 bytes of data for the first memory access operation (read or write to/from the specified address).

Continuing with the illustrated example of FIG. 7, in the high phase of clock cycle 0, encoded address/control command 717 is received by control logic 401 (of FIG. 5) via address/control channel 703. Control logic 401 decodes the received command 717 to produce the address and control command for internal address/control channel 710 (e.g., internal address/control channel 503 of FIG. 5). In this example, the address and control command 717 received by control logic 401 can be decoded to produce both a row select command and a column access command for a memory access operation. Thus, as a result of such decoding, control logic 401 places row select command 731 for a second memory access operation on internal address/control channel 710 in clock cycle 2, and places column access command 732 for the second memory access operation on internal address/control channel 710 in clock cycle 3.

After a predefined delay (the DRAM's data access delay), data channel 711 carries the data "burst" for the second memory access operation. For instance, beginning in the high phase of clock cycle 10 and ending in the low phase of clock cycle 14, data burst 733 carries the data for the second memory access operation. In this exemplary implementation, data burst 733 carries 8-bytes of data for the second memory access operation. For instance, data channel 711 is implemented as an 8-bit (1-byte) wide channel, wherein each memory access comprises a "burst" length of 8 time units (e.g., clock phases), thus resulting in the data channel carrying 8 bytes of data for each access.

Continuing further with the illustrated example of FIG. 7, in the low phase of clock cycle 1, encoded address/control command 718 is received by control logic 401 (of FIG. 5) via address/control channel 703. Control logic 401 decodes the received information 718 to produce row select command 737 and column access command 738 for a third memory access operation, which are placed on internal address/control channel 707 in clock cycles 2 and 3, respectively. In response, beginning in the high phase of clock cycle 10 and ending in the low phase of clock cycle 14, data burst 739 carries the data for the third memory access operation on data channel 708 in a manner similar to that discussed above for data bursts 722 and 733.

In the high phase of clock cycle 1, encoded address/control command 719 is received by control logic 401 (of FIG. 5) via address/control channel 703. Control logic 401 decodes the received command 719 to produce row select command 743 and column access command 744 for a fourth memory access operation, which are placed on internal address/control channel 713 in clock cycles 3 and 4, respectively. In response, beginning in the high phase of clock cycle 11 and ending in the low phase of clock cycle 15, data burst 745 carries the data for the fourth memory access operation on data channel 714 in a manner similar to that discussed above for data bursts 722 and 733.

In the low phase of clock cycle 2, encoded address/control command 750 is received by control logic 401 (of FIG. 5) via address/control channel 703. Control logic 401 decodes the received command 750 to produce row select command 723 and column access command 724 for a fifth memory access operation, which are placed on internal address/control channel 704 in clock cycles 3 and 4, respectively. In response, beginning in the high phase of clock cycle 11 and ending in the low phase of clock cycle 15, data burst 725 carries the data for the fifth memory access operation on data channel 706 in a manner similar to that discussed above for data bursts 722 and 733.

In the high phase of clock cycle 2, encoded address/control command 751 is received by control logic 401 (of FIG. 5) via address/control channel 703. Control logic 401 decodes the received command 751 to produce row select command 734 and column access command 735 for a sixth memory access operation, which are placed on internal address/control channel 710 in clock cycles 4 and 5, respectively. In response, beginning in the high phase of clock cycle 12 and ending in the low phase of clock cycle 16, data burst 736 carries the data for the sixth memory access operation on data channel 712 in a manner similar to that discussed above for data bursts 722 and 733.

In the low phase of clock cycle 3, encoded address/control command 752 is received by control logic 401 (of FIG. 5) via address/control channel 703. Control logic 401 decodes the received command 752 to produce row select command 740 and column access command 741 for a seventh memory access operation, which are placed on internal address/control channel 707 in clock cycles 4 and 5, respectively. In response, beginning in the high phase of clock cycle 12 and ending in the low phase of clock cycle 16, data burst 742 carries the data for the seventh memory access operation on data channel 709 in a manner similar to that discussed above for data bursts 722 and 733.

In the high phase of clock cycle 3, encoded address/control command 753 is received by control logic 401 (of FIG. 5) via address/control channel 703. Control logic 401 decodes the received command 753 to produce row select command 746 and column access command 747 for a eighth memory access operation, which are placed on internal address/control channel 713 in clock cycles 5 and 6, respectively. In response, beginning in the high phase of clock cycle 13 and ending in the low phase of clock cycle 17, data burst 748 carries the data for the eighth memory access operation on data channel 715 in a manner similar to that discussed above for data bursts 722 and 733.

Operation may continue in a similar manner, as illustrated in FIG. 7. The exemplary tiling technique of FIG. 7 allows for the address/control channel 703, as well as the internal address/control channels 704, 707, 710, and 713, to be used to maintain high bandwidth utilization of the data channels 705-706, 708-709, 711-712, and 714-715, as illustrated in FIG. 7. This tiling enables the same memory bandwidth for non-sequential access of 8-byte quantities of data to be supported as for traditional sequential 64-byte access. For instance, as shown, the exemplary tiling technique of FIG. 7 allows for data burst 727 to occur immediately following data burst 722 on data channel 705 for servicing another memory access operation, thus maintaining high bandwidth utilization on data channel 705. Similarly, as illustrated in FIG. 7, the exemplary tiling technique allows for data burst 730 to occur immediately following data burst 725 on data channel 706 for servicing another memory access operation, thus maintaining high bandwidth utilization on data channel 706.

Thus, in the above example of FIGS. 5-7, a memory module is provided that includes eight independent 8-bit wide data channels. In operation, for a respective independent memory access operation being serviced by one of the eight data channels, the data channel carries data in a burst of 8 time units (e.g., 8 clock phases), thereby carrying 8 bytes of data for servicing the respective independent memory access operation. Thus, over a time period during which a cache-block of data (e.g., 64 bytes of data) is carried by the data channels, each data channel carries an independent 8-byte sub-cache-block of data. While a specific example of eight data channels that are each 8-bits in width carry data in a burst of 8 time units, it should be recognized that this is merely an illustrative example, and in other embodiments a different number of independent data channels each having different width and/or carrying data in a burst of more or less than 8 time units may be employed. Thus, those of ordinary skill in the art should recognize that the concepts presented herein are not limited to the specific architecture described, but may likewise be employed for other memory module architectures that employ a plurality of independent data channels, wherein any number of two or more data channels may be employed, each data channel may have any desired width, and/or each data channel may carry data for an independent memory access over any time frame as may be desired for a given system.

It should be recognized that embodiments of the multi-data channel memory module may, in some implementations, be employed across multiple DRAM ranks. For instance, as is well known in the art, a single address/control channel, such as address/control channel 500 of FIG. 5, may be employed for use by multiple ranks.

Figure 8:
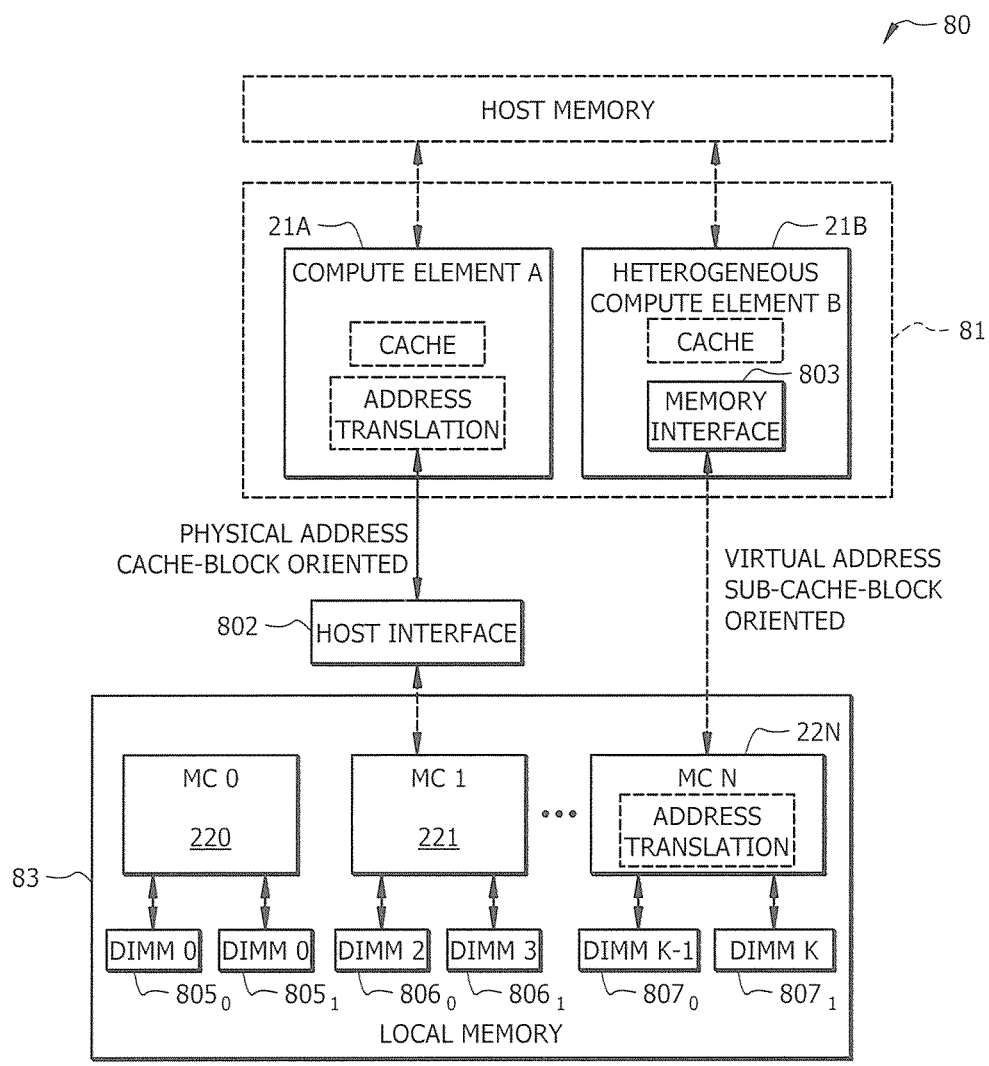
FIG. 8 shows an exemplary system in which multi-data channel memory modules are implemented according to one embodiment of the present invention.

FIG. 8 shows an exemplary system 80 in which multi-data channel memory modules according to embodiments of the present invention may be implemented. An embodiment of the exemplary system 80 is described further in concurrently-filed U.S. patent application Ser. No. 12/186,344 titled "MEMORY INTERLEAVE FOR HETEROGENEOUS COMPUTING", the disclosure of which is incorporated herein by reference. For instance, as discussed further below, embodiments of the multi-data channel memory modules as described herein may be implemented as the DIMM modules $805_0$-$805_1$, $806_0$-$806_1$, and $807_0$-$807_1$, of memory subsystem 83 of system 80.

In exemplary system 80, a processing subsystem 81 and a memory subsystem 83 are provided. In this exemplary embodiment, processing subsystem 81 comprises compute elements 21A and 21B. Compute element 21A is cache-block oriented and issues to a memory interleave system a physical address for a cache-block memory access request, while compute element 21B is sub-cache-block oriented and issues to the memory interleave system a virtual address for a sub-cache-block access request. As discussed hereafter, in this example, the memory interleave system comprises a host interface 802 that receives requests issued by compute element 21A, and the memory interleave system comprises a memory interface 803 that receives requests issued by heterogeneous compute element 21B.

In this exemplary implementation, the storage elements associated with each memory controller $22_0$-$22_N$ comprise a pair of DIMMs. For instance, a first pair of DIMMs $805_0$-$805_1$ is associated with memory controller $22_0$ a second pair of DIMMs $806_0$-$806_1$ is associated with memory controller 221, and a third pair of DIMMs $807_0$-$807_1$ is associated with memory controller $22_N$. In one embodiment, there are 8 memory controllers implemented, but a different number may be implemented in other embodiments. The DIMMs may each comprise a multi-data channel memory module, such as the exemplary embodiments described above with FIGS. 2-7.

Further details regarding exemplary system 80, including a memory interleaving scheme that may be employed therein, are described in concurrently-filed U.S. patent application Ser. No. 12/186,344 titled "MEMORY INTERLEAVE FOR HETEROGENEOUS COMPUTING", the disclosure of which is incorporated herein by reference. While system 80 provides one example of a system in which multi-data channel memory modules may be implemented, embodiments of the multi-data channel memory modules disclosed herein are not limited in application to this exemplary system 80, but may likewise be employed in any other system in which such multi-data channel memory modules may be desired.

In certain embodiments, the multi-data channel memory module may be utilized for supporting cache-block memory accesses, as well as supporting sub-cache-block data accesses. In certain embodiments, upon receiving a cache-block access request, the eight data channels $505_0$-$505_7$ (of FIG. 5) may be reserved (to place any sub-cache-block access requests received thereafter "on hold" until the eight data channels are used for satisfying the cache-block access request), and the eight data channels may then be used to fully, in one burst, satisfy the 64-byte cache-block access request, in a manner similar to traditional DIMMs.

In other embodiments, no such reservation is employed for cache-block access requests, but instead the cache-block access request may be handled by the eight data channels $505_0$-$505_7$ (of FIG. 5) along with an intermingling of any sub-cache-block access requests that might be present at that time, wherein the cache-block access may be satisfied by the data channels within a window of time, and the 64 bytes of the cache-block access returned by the data channels within the window of time may be bundled by logic (e.g., memory controller 42) into the requested 64 byte cache block of data. Thus, rather than supplying the same address and request type (e.g., either a read or write) to all eight data channels simultaneously for satisfying a cache-block access request, in certain embodiments, such address and request type for the cache-block access may in a first instance be supplied to a portion of the eight data channels (which each returns their respective portion of the requested cache block) and in a later instance (within a window of time) a further portion of the eight data channels may be supplied the address and request type in order to return the remaining portion of the requested cache block. The two portions of the cache block may then be bundled together (e.g., by memory controller 42) to form the requested cache block of data. In other words, rather than satisfying a cache-block access in a single burst of data, in certain embodiments portions of the cache-block of data may be returned over a plurality of bursts (e.g., with independent sub-cache-block bursts of data intermingled therewith), and the appropriate portions may be bundled together to form a congruent burst of cache-block data.

Thus, in certain embodiments, cache-block (e.g., 64-byte) accesses may be intermixed with sub-cache-block (e.g., 8-byte) accesses, and each 8-byte data channel $505_0$-$505_7$ (of FIG. 5) of the memory module is scheduled independently to support the intermixing. Thus, a cache-block access may not necessarily be performed using all eight data channels for returning the entire cache-block in a single, congruent burst in the manner mentioned above, but instead, at a given time some of the eight 8-byte data channels may be used for performing a sub-cache-block access while some others of the eight 8-byte data channels are used for the cache-block access. Thus, the cache-block access may be returned within a window of time by the data channels, wherein a controller 42 bundles the returned data into the requested cache-block.

In certain embodiments, the multi-data channel memory module may be configurable into either of at least two modes of operation. For instance, in one embodiment, the multi-data channel memory module may be statically or dynamically configurable (e.g., through programming of FPGA 401A of FIG. 6) to operate as a traditional DIMM in which the multiple data channels are used together as a single data channel for servicing received memory access requests via cache-block bursts of data, such as discussed above with FIG. 2. And, the multi-data channel memory module may be statically or dynamically configurable (e.g., through programming of FPGA 401A of FIG. 6 or selecting an operating mode through a register access) to operate in the manner discussed above with FIGS. 4-7 such that the multiple data channels are operable to each service independent memory access requests via sub-cache-block bursts of data. In certain embodiments, the control logic (e.g., FPGA 401A) may include both a configuration for operating as a traditional DIMM (in which the multiple data channels are used together as a single data channel for servicing received memory access requests via cache-block bursts of data) and a configuration for operating as a multi-data-channel module as discussed above, and a command may be received (e.g., from a register) to select which of the configurations should be active at any given time for servicing memory access requests. In this way, an executable (e.g., software application) or portion thereof that may benefit from cache-block oriented memory accesses can dynamically configure the multi-data channel memory module for operating in a traditional manner, whereas an executable (e.g., software application) or portion thereof that may benefit from sub-cache-block oriented memory accesses can dynamically configure the multi-data channel memory module for employing its multiple data channels for each servicing independent memory access requests via sub-cache-block bursts of data such as discussed above with FIGS. 4-7.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory module comprising:
   memory enabling simultaneous access to a plurality of sub cache blocks a for servicing a cache block access;
   multiple, independent data channels communicatively coupled to said memory, each data channel supporting a sub cache block access to a corresponding sub cache block, wherein an access bus of said memory module is partitioned into eight independent eight-byte sub-buses such that multiple ones of said multiple, independent data channels may be used for servicing said cache-block access; and
   a separate address/control channel dedicated for receiving only address and control information for memory operations for at least one of the pluralities of the sub cache blocks comprising the cache block access to be simultaneously serviced by the multiple, independent data channels, such that an address and a request type is independently supported for each of said eight-byte sub-buses individually.

2. The memory module of claim 1 wherein said memory module comprises a dual in-line memory module (DIMM).

3. The memory module of claim 1 wherein said memory for storing data comprises at least one dynamic random access memory (DRAM).

4. The memory module of claim 3 wherein said memory comprises a plurality of separate DRAMs, and wherein each of the multiple, independent data channels provides access to a different one of the plurality of separate DRAMs.

5. The memory module of claim 1 wherein each of the multiple, independent data channels provides access to a different portion of said memory.

6. The memory module of claim 1 wherein the multiple, independent data channels are operable to carry data for independent memory access operations.

7. The memory module of claim 6 wherein the multiple, independent data channels comprise:
   eight 8-bit wide data channels.

8. The memory module of claim 7 wherein, for a respective independent memory access operation being serviced by one of the eight data channels, the one data channel carries data in a burst of 8 time units, thereby carrying 8 bytes of data for servicing the respective independent memory access operation.

9. The memory module of claim 1 wherein each of the multiple, independent data channels is operable to carry a sub-cache-block of data for independent memory access operations.

10. The memory module of claim 9 wherein, over a time period for carrying a cache-block of data, the multiple, independent data channels each carry a sub-cache-block of data.

11. The memory module of claim 10 wherein each of the multiple, independent data channels carries said sub-cache-block of data for servicing a different, independent memory access operation.

12. The memory module of claim 11 wherein the time period for carrying said cache-block of data comprises an 8 time unit burst of 64-bytes of data.

13. The memory module of claim 12 wherein the 8 time unit burst comprises either 8 clock cycles or 8 clock phases.

14. The memory module of claim 12 wherein during said 8 time unit burst said multiple, independent data channels each carries 8-bytes of data for a different one of eight independent memory access operations.

15. The memory module of claim 1 further comprising:
    control logic for receiving address and control information for a plurality of independent memory access operations to be serviced by the multiple, independent data channels.

16. The memory module of claim 15 wherein the control logic receives the address and control information from an external memory controller via the separate address/control channel.

17. The memory module of claim 16 wherein dual data rate (DDR) signaling is employed for the received address and control information.

18. The memory module of claim 15 wherein the received address and control information comprises row select and column access commands encoded into a single command.

19. The memory module of claim 18 further comprising:
    a plurality of internal address/control channels for carrying address and control information for the multiple, independent data channels, wherein the control logic is operable to decode the received address and control information to result in address and control information for the plurality of internal address/control channels.

20. The memory module of claim 19 wherein the plurality of internal address/control channels comprise four independent internal address/control channels.

21. The memory module of claim 20 wherein the multiple, independent data channels comprise eight independent data channels, and wherein each of the four independent internal address/control channels carries address and control information for two of the eight independent data channels.

22. A memory module comprising:
    memory enabling simultaneous access to a plurality of sub cache blocks for servicing a cache block access;
    a plurality of independent data channels for accessing said memory, each data channel supporting a sub cache block access, wherein an access bus of said memory module is partitioned into eight independent eight-byte sub-buses such that multiple ones of said plurality of independent data channels may be used for servicing said cache-block access;
    an external address/control channel for receiving address and control information for memory operations for at least one of the pluralities in the cache block to be serviced by the plurality of independent data channels, wherein said external address/control channel is separate from the plurality of independent data channels;
    a plurality of internal address/control channels for carrying address and control information for the plurality of independent data channels, such that an address and a request type is independently supported for each of said eight-byte sub-buses individually; and
    control logic operable to receive, via the external address/control channel, encoded address and control information, and decode the received address and control information to result in address and control information for the plurality of internal address/control channels.

23. The memory module of claim 22 wherein each of the plurality of independent data channels is operable to service an independent memory access operation as specified by the decoded address and control information on the internal address/control channels.

24. The memory module of claim 22 wherein the decoded address and control information specifies a plurality of independent memory access operations, and wherein the plurality of independent data channels each carries data for a separate one of the plurality of independent memory access operations.

25. The memory module of claim 22 wherein said memory comprises a plurality of separate memories, and wherein each of the plurality independent data channels provides access to a different one of the plurality of separate memories.

26. The memory module of claim 25 wherein each of the plurality of separate memories comprises a dynamic random access memory (DRAM).

27. The memory module of claim 22 wherein said memory module comprises a dual in-line memory module (DIMM).

28. The memory module of claim 22 wherein the plurality of independent data channels comprise:
eight 8-bit wide data channels.

29. The memory module of claim 28 wherein, for a respective independent memory access operation being serviced by one of the eight data channels, the one data channel carries data in a burst of 8 time units, thereby carrying 8 bytes of data for servicing the respective independent memory access operation.

30. The memory module of claim 22 wherein each of the plurality of independent data channels is operable to carry a sub-cache-block of data for independent memory access operations.

31. The memory module of claim 30 wherein, over a time period for carrying a cache-block of data, the plurality of independent data channels each carry a sub-cache-block of data.

32. The memory module of claim 31 wherein, over the time period for carrying the cache-block of data, the plurality of independent data channels carry in aggregate a cache-block of data.

33. The memory module of claim 31 wherein each of the plurality of independent data channels carries said sub-cache-block of data for servicing a different, independent memory access operation.

34. The memory module of claim 33 wherein the time period for carrying said cache-block of data comprises an 8 time unit burst of 64-bytes of data.

35. The memory module of claim 34 wherein the 8 time unit burst comprises either 8 clock cycles or 8 clock phases.

36. The memory module of claim 34 wherein during said 8 time unit burst said plurality of independent data channels each carries 8-bytes of data for a different one of eight independent memory access operations.

37. The memory module of claim 22 wherein the received encoded address and control information comprises row select and column access commands encoded into a single command.

38. The memory module of claim 37 wherein dual data rate (DDR) signaling is employed for the received encoded address and control information.

39. The memory module of claim 22 wherein the plurality of internal address/control channels comprise four independent internal address/control channels.

40. The memory module of claim 39 wherein the plurality of independent data channels comprise eight independent data channels, and wherein each of the four independent internal address/control channels carries address and control information for two of the eight independent data channels.

41. The memory module of claim 22 wherein the control logic comprises a field-programmable gate array (FPGA).

42. The memory module of claim 22 wherein the control logic comprises an application-specific integrated circuit (ASIC).

43. The memory module of claim 22 wherein said external address/control channel is dedicated for only receiving address and control information for memory operations to be serviced by the plurality of independent data channels.

44. A memory module comprising:
memory enabling simultaneous access to a plurality of sub cache blocks for servicing a cache block access;
a plurality of independent data channels communicatively coupled to said memory, wherein each of the plurality of independent data channels is operable to carry a sub-cache-block of data of at least one of the pluralities of sub-cache blocks in the cache block for independent memory access operations, wherein an access bus of said memory module is partitioned into eight independent eight-byte sub-buses such that multiple ones of said plurality of independent data channels may be used for servicing said cache-block access; and
a separate address/control channel dedicated for only receiving address and control information for memory operations to be serviced by the plurality of independent data channels such that an address and a request type is independently supported for each of said eight-byte sub-buses individually.

45. The memory module of claim 44 wherein, over a time period for carrying a cache-block of data, the plurality of independent data channels each carry said sub-cache-block of data.

46. The memory module of claim 45 wherein, over the time period for carrying the cache-block of data, the plurality of independent data channels carry in aggregate a cache-block of data.

47. The memory module of claim 45 wherein each of the plurality of independent data channels carries said sub-cache-block of data for servicing a different, independent memory access operation.

48. The memory module of claim 47 wherein the time period for carrying said cache-block of data comprises an 8 time unit burst of 64-bytes of data.

49. The memory module of claim 48 wherein the 8 time unit burst comprises either 8 clock cycles or 8 clock phases.

50. The memory module of claim 48 wherein during said 8 time unit burst said plurality of independent data channels each carries 8-bytes of data for a different one of eight independent memory access operations.

51. A method of servicing memory access requests, the method comprising:
receiving, at a memory of a memory module enabling simultaneous access to a plurality of sub cache blocks for servicing a cache block access, via an external address/control channel, encoded address and control information for a plurality of independent memory access operations for at least one of the pluralities of sub cache blocks, wherein an access bus of said memory module is partitioned into eight independent eight-byte sub-buses such that multiple ones of said eight independent eight-byte sub-buses may be used for servicing said cache-block access, said external address/control channel being configured such that an address and a request type is independently supported for each of said eight-byte sub-buses individually;

decoding, by control logic of the memory module, the received encoded address and control information into information for a plurality of internal independent address/control channels within the memory module; and carrying data for servicing the plurality of independent memory access operations as defined by the information on the plurality of internal independent address/control channels via a plurality of independent data channels of the memory module, wherein the external address/control channel is separate from the plurality of independent data channels.

52. The method of claim 51 wherein each of the plurality of independent data channels is operable to carry a sub-cache-block of data for a corresponding one of the plurality of independent memory access operations.

53. The method of claim 52 wherein said carrying comprises:

over a time period for carrying a cache-block of data, the plurality of independent data channels each carry said sub-cache-block of data.

54. The method of claim 53 wherein said carrying comprises:

over the time period for carrying the cache-block of data, the plurality of independent data channels carry in aggregate a cache-block of data.

55. The method of claim 53 wherein the time period for carrying said cache-block of data comprises an 8 time unit burst of 64-bytes of data.

56. The memory module of claim 55 wherein during said 8 time unit burst said plurality of independent data channels each carries 8-bytes of data for a different one of eight independent memory access operations.

57. The method of claim 51 wherein said external address/control channel is dedicated for solely carrying said encoded address and control information.

* * * * *

UNITED STATES PATENT AND TRADEMARK OFFICE
CERTIFICATE OF CORRECTION

PATENT NO. : 9,015,399 B2
APPLICATION NO. : 12/186372
DATED : April 21, 2015
INVENTOR(S) : Tony M. Brewer et al.

It is certified that error appears in the above-identified patent and that said Letters Patent is hereby corrected as shown below:

In the Specification:
At column 2, line number 28, delete "instructions" and replace with --instructions,--.
At column 3, line number 22, delete "L2." and replace with --L2,--.
At column 3, line number 41, delete "(TBL)" and replace with --(TLB)--.
At column 3, line number 53, delete "1223456" and replace with --123456--.
At column 3, line number 57, delete "104" and replace with --104B--.
At column 4, line number 35, delete "Operand 1" and replace with --Operand 1,--.
At column 5, line number 60, delete "bandwidth" and replace with --bandwidth,--.
At column 6, line number 49, delete "rite" and replace with --write--.
At column 7, line number 25, delete "When" and replace with --when--.
At column 7, line number 60, delete "non-cache-block compute device" and replace with --non-cache-block oriented compute device--.
At column 8, line number 2, delete "CPU" and replace with --GPU--.
At column 14, line number 55, delete "wwwjedec.org" and replace with --www.jedec.org--.
At column 17, line number 24, delete "signals such" and replace with --signals, such--.
At column 17, line number 43, delete "and byte" and replace with --and 1 byte--.
At column 20, line number 31, delete "caries" and replace with --carries--.
At column 23, line number 2, delete "$807_0$-$80_7$," and replace with --$807_0$-$807_1$--.
At column 23, line number 22, delete "221," and replace with --$22_1$,--.
In the Claims:
At column 25, claim number 1, line number 20, delete "blocks a for" and replace with --blocks for--.
At column 28, claim number 44, line number 31, delete "channels such" and replace with --channels, such--.

Signed and Sealed this
Fourth Day of August, 2015

Michelle K. Lee
*Director of the United States Patent and Trademark Office*